United States Patent [19]
Onishi et al.

[11] Patent Number: 5,721,519
[45] Date of Patent: Feb. 24, 1998

[54] BALANCED TYPE SURFACE ACOUSTIC WAVE DEVICE

[75] Inventors: Keiji Onishi, Osaka; Kazuo Eda, Nara; Yutaka Taguchi, Osaka; Shunichi Seki, Hyogo, all of Japan

[73] Assignee: Matsushita Electric Industrial Co., Ltd., Osaka, Japan

[21] Appl. No.: 517,577

[22] Filed: Aug. 21, 1995

[30] Foreign Application Priority Data

Aug. 23, 1994 [JP] Japan .................................. 6-198412

[51] Int. Cl.$^6$ ...................................................... H03H 9/64
[52] U.S. Cl. .................... 333/193; 333/194; 310/313 R
[58] Field of Search ...................... 333/193–196, 333/132, 133; 310/313 R, 313 B, 313 C, 313 D

[56] References Cited

U.S. PATENT DOCUMENTS

| | | | |
|---|---|---|---|
| 3,573,673 | 4/1971 | De Vries et al. | 333/72 |
| 3,886,504 | 5/1975 | Hartmann et al. | 333/72 |
| 4,044,321 | 8/1977 | Vasile | 333/72 |
| 4,126,837 | 11/1978 | Koyamada et al. | 333/72 |
| 4,278,492 | 7/1981 | Cross et al. | 333/196 |
| 4,354,130 | 10/1982 | Ono et al. | 310/313 A |
| 4,785,270 | 11/1988 | Kinsman | 333/193 |
| 5,093,638 | 3/1992 | Kusman et al. | 333/195 |

FOREIGN PATENT DOCUMENTS

| | | |
|---|---|---|
| 52-19044 | 2/1977 | Japan . |
| 58-154917 | 9/1983 | Japan . |
| 2127810 | 5/1990 | Japan . |
| 4229710 | 8/1992 | Japan . |
| 05617389 | 7/1993 | Japan . |
| 5-183380 | 7/1993 | Japan . |
| 5335881 | 12/1993 | Japan . |
| 2 116 387 | 9/1983 | United Kingdom . |

OTHER PUBLICATIONS

"1992 Ultrasonics Symposium" (pp. 111–115).
"IEEE Transactions on Vehicular Technology, vol.38, 1989" (pp. 2–8).
"Proceedings on 1994 MTT–Symposium (1994) WE4A–2".

*Primary Examiner*—Benny Lee
*Assistant Examiner*—Darius Gambino
*Attorney, Agent, or Firm*—Merchant, Gould, Smith, Edell, Welter & Schmidt, P.A.

[57] ABSTRACT

The present invention provides surface acoustic wave devices which do not require a balanced-to-unbalanced transformer circuit regardless of the type of the peripheral circuits of the balanced type surface acoustic wave filter, i.e. a balanced type device or an unbalanced type. A transmitting interdigital transducer and a receiving interdigital transducer are formed on a substrate comprising 41° Y cut-X propagation lithium niobate. A balanced type surface acoustic wave filter is formed on a substrate comprising 36° Y cut-X propagation lithium tantalate. The balanced type surface acoustic wave filter comprises two series-arm surface acoustic wave resonators and two crossed-arm surface acoustic wave resonators connected in a lattice. The substrate on which the transmitting interdigital transducer and the receiving interdigital transducer are formed and the substrate on which the balanced type surface acoustic wave filter is formed are located in a ceramic package. One of the input terminals of the transmitting interdigital transducer is grounded. The output terminals of the receiving interdigital transducer are connected to the input terminals of the balanced type surface acoustic wave filter.

14 Claims, 12 Drawing Sheets

BALANCED TYPE SURFACE ACOUSTIC WAVE DEVICE

BACKGROUND OF THE INVENTION

1. Field of the Invention

This invention relates to a surface acoustic wave (SAW) device which can be used in mobile communication devices, more specifically to a surface acoustic wave device which can be used in a filter to penetrate electric signals having a certain frequency.

2. Description of the Related Art

With the development of mobile communication, demand for acoustic surface wave filters for mobile communication devices with high quality characteristics have been increased. Surface acoustic wave filters have been broadly used as a band pass filter in high frequency circuits of mobile communication devices. Known examples of electrode patterns of surface acoustic wave filters include a resonator type as disclosed in P.111–114 of Proceedings on 1992 Ultrasonic Symposium in 1992, Japanese Patent Application Laid Open No. 19044/1977 and Japanese Patent Application Laid Open No. 183380/1993, and an interdigitated interdigital transducer (IIDT) type as disclosed in P.2–8 of IEEE Transactions on Vehicular Technology Vol. 38 No. 1 in 1989 and Japanese Patent Application Laid Open No. 154917/1983. Such resonator type filters and interdigitated interdigital transducer type filters are used as unbalanced type devices for inputting or outputting unbalanced signals.

In general, forming a balanced circuit as a high frequency circuit is advantageous in various aspects. Since a grounded wiring is unnecessary in principle, a high frequency circuit can be designed more freely to allow downsizing of the device. Further, noise reduction can be achieved and low voltage drive in an active device including an amplifier can be enabled. Consequently, by forming a balanced circuit as a high frequency circuit, downsizing and quality improvement of mobile communication devices including cellular phones can be realized. However, since various devices comprising a high frequency have not been comprised of a balanced circuit yet, unbalanced type devices are mainly used in a high frequency circuit with respect to the matching with peripheral circuits.

On the other hand, forming a balanced circuit in a surface acoustic wave filter is feasible in principle, and thus practical application of surface acoustic wave filters in mobile communication devices are expected as disclosed in Proceedings on 1994 MTT-Symposium (1994) WD4A-2.

However, when both a balanced type device and an unbalanced type device are used, a balanced-to-unbalanced transformer circuit to transform a balanced signal to an unbalanced signal is necessary. As a consequence, although characteristics of various high frequency parts are improved, the increase of the number of parts prohibits the downsizing and production cost reduction of the device.

The object of the present invention is to provide a surface acoustic wave device which does not require a balanced-to-unbalanced transformer circuit whether peripheral circuits of the balanced type surface acoustic wave filter comprise a balanced type device or an unbalanced type device.

In order to achieve the above-mentioned object, a first aspect of the surface acoustic wave devices of the present invention comprises a transmitting interdigital transducer with one terminal grounded, a receiving interdigital transducer to receive and transform the surface acoustic waves generated by the transmitting interdigital transducer into electric signals, and a balanced type surface acoustic wave filter connected to the receiving interdigital transducer.

A second aspect of the surface acoustic wave devices of the present invention comprises a balanced type surface acoustic wave filter, a transmitting interdigital transducer connected to the balanced type surface acoustic wave filter, and a receiving interdigital transducer with one terminal grounded which is to receive and transform the surface acoustic waves generated by the transmitting interdigital transducer into electric signals.

A third aspect of the surface acoustic wave devices of the present invention comprises a first transmitting interdigital transducer with one terminal grounded, a first receiving interdigital transducer to receive and transform the surface acoustic waves generated by the first transmitting interdigital transducer to electric signals, a balanced type surface acoustic wave filter connected to the first receiving interdigital transducer, a second transmitting interdigital transducer connected to the balanced type surface acoustic wave filter, and a second receiving interdigital transducer with one terminal grounded which is to receive and transform the surface acoustic waves generated by the second transmitting interdigital transducer into electric signals.

In the above mentioned first to third aspects of the present invention, it is preferable to locate a plurality of transmitting interdigital transducers and a plurality of receiving interdigital transducers alternately to the propagation direction of surface acoustic waves.

In the above mentioned first to third aspects of the present invention, it is further preferable to provide reflectors at outer ends of the transmitting interdigital transducers and receiving interdigital transducers.

A fourth aspect of the surface acoustic wave devices of the present invention comprises a transmitting interdigital transducer with one terminal grounded, first and second receiving interdigital transducers, each with one terminal grounded and located at both sides of the transmitting interdigital transducer to receive surface acoustic waves generated by the transmitting interdigital transducer as surface acoustic waves having different phases and transform them to electric signals, and a balanced type surface acoustic wave filter connected to the first and second receiving interdigital transducers.

A fifth aspect of the surface acoustic wave devices of the present invention comprises a balanced type surface acoustic wave filter, first and second transmitting interdigital transducers with one terminal grounded and connected to the balanced type surface acoustic wave filter, and a receiving interdigital transducer with one terminal grounded and located to receive surface acoustic waves generated by the first and second transmitting interdigital transducers and transform them to electric signals.

A sixth aspect of surface acoustic wave devices of the present invention comprises a first transmitting interdigital transducer with one terminal grounded, first and second receiving interdigital transducers, each with one terminal grounded and located at both sides of the first transmitting interdigital transducer to receive surface acoustic waves generated by the first transmitting interdigital transducer as surface acoustic waves having different phases and transform them to electric signals, a balanced type surface acoustic wave filter connected to the first and second receiving interdigital transducers, second and third transmitting interdigital transducers, each with one terminal grounded and connected to the balanced type surface acoustic wave filter, and a third receiving interdigital transducer with one terminal grounded, and located to receive surface acoustic waves generated by the second and third transmitting interdigital transducers and transform them to electric signals.

In the above mentioned fourth to sixth aspects of the present invention, it is preferable to locate a plurality of transmitting interdigital transducers and a plurality of receiving interdigital transducers alternately to the propagation direction of surface acoustic waves.

In the above mentioned fourth to sixth aspects of the present invention, it is further preferable to provide reflectors at the outer ends of the transmitting interdigital transducers and receiving interdigital transducers.

In the above mentioned first to sixth aspects of the present invention, it is further preferable that the balanced type surface acoustic wave filter comprises four surface acoustic wave resonators connected in a lattice. In this case, it is preferable that a plurality of balanced type surface acoustic wave filters are connected and used.

In the above mentioned first to sixth aspects of the present invention, it is preferable that the frequency at which the insertion loss of frequency characteristics yielded by the transmitting interdigital transducer and the receiving interdigital transducer is at a minimum is approximately the same as the center frequency of the balanced type surface acoustic wave filter.

In the above mentioned first, third, fourth and sixth aspects of the present invention, it is preferable to provide an impedance matching circuit between the output terminals of the receiving interdigital transducer and the input terminals of the balanced type surface acoustic wave filter.

In the above mentioned second, third, fifth and sixth aspects of the present invention, it is preferable to provide an impedance matching circuit between the output terminals of the balanced type surface acoustic wave filter and the input terminals of the transmitting interdigital transducer.

In the above mentioned first to sixth aspects of the present invention, it is preferable that the physical properties of the substrate on which the transmitting interdigital transducer and the receiving interdigital transducer are formed differ from the physical properties of the substrate on which the balanced type surface acoustic wave filter is formed. In this case, it is preferable that the electro-mechanical coupling coefficient of the substrate on which the transmitting interdigital transducer and the receiving interdigital transducer are formed is greater than the electro-mechanical coupling coefficient of the substrate on which the balanced type surface acoustic wave filter is formed. In this case, it is preferable that the frequency temperature coefficient of the substrate on which the transmitting interdigital transducer and the receiving interdigital transducer are formed and the frequency temperature coefficient of the substrate on which the balanced type surface acoustic wave filter is formed are approximately the same. In this case, it is preferable that the substrate on which the transmitting interdigital transducer and the receiving interdigital tranducer are formed and the substrate on which the balanced type surface acoustic wave filter is formed are located in an airtight container. In this case, it is more preferable that the impedance matching circuit located between the output terminals of the receiving interdigital transducer and the input terminals of the balanced type surface acoustic wave filter is located in an airtight container, and further the airtight container comprises a multi-layered dielectric substrate. In this case, it is more preferable that the impedance matching circuit between the output terminals of the balanced type surface acoustic wave filter and the input terminals of the transmitting interdigital transducer is located in an airtight container, and further the airtight container comprises a multi-layered dielectric substrate.

In the above mentioned first to sixth aspects of the present invention, it is preferable that the transmitting interdigital transducer, the receiving interdigital transducer and the balanced type surface acoustic wave filter are formed on the same substrate. In this case, it is preferable that the film thickness of the electrode comprising the transmitting interdigital transducer and the receiving interdigital transducer is thicker than the film thickness of the electrode comprising the balanced type surface acoustic wave filter. In this case, it is further preferable that the impedance matching circuit located between the output terminals of the receiving interdigital transducer and the input terminals of the balanced type surface acoustic wave filter is located in an airtight container, and further the airtight container comprises a multi-layered dielectric substrate. In this case, it is further preferable that the impedance matching circuit located between the output terminals of the balanced type surface acoustic wave filter and the input terminals of the transmitting interdigital transducer is located in an airtight container, and further the airtight container comprises a multi-layered dielectric substrate.

SUMMARY OF THE INVENTION

Since the above mentioned first aspect of the present invention comprises a transmitting interdigital transducer with one terminal grounded, a receiving interdigital transducer to receive and transform the surface acoustic waves generated by the transmitting interdigital transducer to electric signals, and a balanced type surface acoustic wave filter connected to the receiving interdigital transducer, the following can be achieved. Namely, since the transmitting interdigital transducer has one terminal grounded, unbalanced signals are inputted to the transmitting interdigital transducer. When the unbalanced signals are inputted to the transmitting interdigital transducer, surface acoustic waves are generated at the transmitting interdigital transducer, and the surface acoustic wave is received at the receiving interdigital transducer. In this case, since none of the terminals of the receiving interdigital transducers is grounded, surface acoustic waves which are out of phase by 180° are received at each terminal. Therefore the surface acoustic waves received at the receiving interdigital transducer are transformed to electric signals as balanced signals and inputted to the balanced type surface acoustic wave filter connected to the receiving interdigital transducer. Accordingly, even when the input side peripheral circuit of the surface acoustic wave device is an unbalanced type and the output side peripheral circuit of the surface acoustic wave device is a balanced type, a balanced-to-unbalanced transformer is unnecessary, and a compact and high quality surface acoustic wave device can be obtained. As a consequence, since a balanced type device can be used in high frequency parts, characteristics of a high frequency circuit part can be improved.

Since the above mentioned second aspect of the present invention comprises a balanced type surface acoustic wave filter, a transmitting interdigital transducer connected to the balanced type surface acoustic wave filter, and a receiving interdigital transducer with one terminal grounded and to receive surface acoustic waves generated by the transmitting interdigital transducer and transform them to electric signals, the following can be achieved. Namely, the balanced signals outputted from the balanced type surface acoustic wave filter are inputted to the transmitting interdigital transducer connected to the balanced type surface acoustic wave filter. When the balanced signals are inputted to the transmitting interdigital transducer, surface acoustic waves are generated at the transmitting interdigital transducer and the surface acoustic waves are received at the receiving interdigital transducer. In this case, since one terminal of the receiving interdigital transducer is grounded, the surface acoustic waves received at the receiving interdigital transducer are transformed to electric signals as unbalanced signals. Accordingly, even when the input side peripheral circuit of the surface acoustic wave device is a balanced type and the output side peripheral circuit of the surface acoustic wave device is an unbalanced type, a balanced-to-unbalanced transformer circuit is unnecessary, and a compact and high quality surface acoustic wave device can be obtained. As a consequence, since a balanced type device can be used in high frequency parts, characteristics of a high frequency circuit part can be improved.

Since the third aspect of the present invention comprises a first transmitting interdigital transducer with one terminal grounded, a first receiving interdigital transducer to receive surface acoustic waves generated by the first transmitting interdigital transducer and transform them to electric signals, a balanced type surface acoustic wave filter connected to the first receiving interdigital transducer, a second transmitting interdigital transducer connected to the balanced type surface acoustic wave filter, and a second receiving interdigital transducer with one terminal grounded, and to receive surface acoustic waves generated by the second transmitting interdigital transducer and transform them to electric signals, the following can be achieved. Namely, since one terminal of the first transmitting interdigital transducer is grounded, unbalanced signals are inputted to the first transmitting interdigital transducer. When unbalanced signals are inputted to the first transmitting interdigital transducer, surface acoustic waves are generated by the first transmitting interdigital transducer, and the surface acoustic waves are received at the first receiving interdigital transducer. In this case, since none of the terminals of the first receiving interdigital transducer is grounded, surface acoustic waves which are out of phase by 180° are received at each terminal. Therefore the surface acoustic waves received at the first receiving interdigital transducer are transformed to electric signals as balanced signals, and inputted to the balanced type surface acoustic wave filter connected to the first receiving interdigital transducer. The balanced signals outputted from the balanced type surface acoustic wave filter are inputted to the second transmitting interdigital transducer connected to the balanced type surface acoustic wave filter. When the balanced signals are inputted to the second transmitting interdigital transducer, surface acoustic waves are generated by the second transmitting interdigital transducer, and the surface acoustic waves are received at the second receiving interdigital transducer. In this case, since one of the terminals of the second receiving interdigital transducer is grounded, the surface acoustic waves received at the second receiving interdigital transducer are transformed to electric signals as unbalanced signals. Accordingly, even when both of peripheral circuits at the input side and the output side of the surface acoustic wave device are an unbalanced type, a balanced-to-unbalanced transformer circuit is unnecessary, and a compact and high quality surface acoustic wave device can be obtained. As a consequence, since such a balanced type device can be used in high frequency parts, characteristics of a high frequency circuit part can be achieved.

In the preferable example of first to third aspects of the present invention, a plurality of transmitting interdigital transducers and a plurality of receiving interdigital transducers are located alternately to the propagation direction of surface acoustic waves, two-way insertion loss of the surface acoustic waves is reduced and the insertion loss of the surface acoustic wave device is decreased. That is, frequency characteristics provided by the transmitting interdigital transducer and the receiving interdigital transducer which perform as a balanced-to-unbalanced transformer circuit are improved, and thus a surface acoustic wave device of superior quality can be obtained.

In the preferable example of the first to third aspects of the present invention, a pair of reflectors are provided at the outer ends of the transmitting interdigital transducers and receiving interdigital transducers, and the insertion loss of the surface acoustic wave device can be reduced.

Since the fourth aspect of the present invention comprises a transmitting interdigital transducer with one terminal grounded, first and second receiving interdigital transducers with one each terminal grounded, and located at both sides of the transmitting interdigital transducer to receive surface acoustic waves generated at the transmitting interdigital transducer as surface acoustic waves having different phases and transform to electric signals, and a balanced type surface acoustic wave filter connected to the first and second receiving interdigital transducers, the following can be achieved. Namely, since one terminal of the transmitting interdigital transducer is grounded, unbalanced signals are inputted to the transmitting interdigital transducer. When unbalanced signals are inputted to the transmitting interdigital transducer, surface acoustic waves are generated by the transmitting interdigital transducer and the surface acoustic waves are received at the first and second receiving interdigital transducers. The surface acoustic waves received at the first and second receiving interdigital transducers are transformed to electric signals and inputted to the balanced type surface acoustic wave filter connected to the first and second receiving interdigital transducers. In this case, since the first and second receiving interdigital transducers each have one terminal grounded, and are located to receive the surface acoustic waves generated by the transmitting interdigital transducer as surface acoustic waves having different phases and tranform to electric signals, the surface acoustic waves outputted from the first and second receiving interdigital transducers are out of phase by 180°, and inputted to the balanced type surface acoustic wave filter as balanced signals. Accordingly, even when the input side peripheral circuit of the surface acoustic wave device is an unbalanced type and the output side peripheral circuit of the surface acoustic wave device is a balanced type, since a balanced-to-unbalanced transformer circuit is unnecessary, and a compact and high quality surface acoustic wave device can be obtained. As a consequence, since a balanced type device can be used in high frequency parts, characteristics of a high frequency circuit part can be achieved.

Since the above mentioned fifth aspect of the present invention comprises a balanced type surface acoustic wave filter, first and second transmitting interdigital transducers with one terminal grounded and connected to the balanced type surface acoustic wave filter, and a receiving interdigital transducer with one terminal grounded and located to receive surface acoustic waves generated by the first and second transmitting interdigital transducers and transform them to electric signals, the following can be achieved. Namely, balanced signals outputted from the balanced type surface acoustic wave filter are inputted to the first and second transmitting interdigital transducers connected to the balanced type surface acoustic wave filter. In this case, since the first and second transmitting interdigital transducers each have one terminal grounded, electric signals having opposite phases are inputted to the first and second transmitting interdigital transducers. When balanced signals are inputted to the first and second transmitting interdigital transducers, surface acoustic waves are generated by the first and second transmitting interdigital transducers, and the surface acoustic waves are received at the receiving interdigital transducer. In this case, since the receiving interdigital transducer has one terminal grounded and is located to receive surface acoustic waves generated by the first and second transmitting interdigital transducers and transform them to electric signals, the surface acoustic waves received at the receiving interdigital transducer have the same phase. Therefore surface acoustic waves received at the receiving interdigital transducer are transformed to electric signals as unbalanced signals, and outputted from the receiving interdigital transducer. Accordingly, even when the input side peripheral circuit of the surface acoustic wave device is a balanced type, and the output side of the peripheral circuit of the surface acoustic wave device is an unbalanced type, since a balanced-to-unbalanced transformer circuit is unnecessary, and a compact and high quality surface acoustic wave device can be obtained. As a consequence, since a balanced type device can be used in high frequency parts, characteristics of a high frequency circuit part can be achieved.

Since the above mentioned sixth aspect of the present invention comprises a first transmitting interdigital transducer with one terminal grounded, first and second receiving interdigital transducers, each with one terminal grounded and located at both sides of the first transmitting interdigital transducer to receive surface acoustic waves generated by the first and second transmitting interdigital transducers as surface acoustic waves having different phases and transform them to electric signals, a balanced type surface acoustic wave filter connected to the first and second receiving interdigital transducers, second and third transmitting interdigital transducers with one terminal grounded connected to the balanced type surface acoustic wave filter and a third receiving interdigital transducer with one terminal grounded and located to receive surface acoustic waves generated by the second and third transmitting interdigital transducers and transform to electric signals, the following can be achieved. Namely, since the first transmitting interdigital transducer has one terminal grounded, unbalanced signals are inputted to the first transmitting interdigital transducer. When the unbalanced signals are inputted to the first transmitting interdigital transducer, surface acoustic waves are generated at the first transmitting interdigital transducer, and the surface acoustic waves are received at the first and second receiving interdigital transducers. The surface acoustic waves received at the first and second receiving interdigital transducers are transformed to electric signals and inputted to the balanced type surface acoustic wave filter connected to the first and second receiving interdigital transducers. In this case, since the first and second receiving interdigital transducers have one terminal grounded and are located at both sides of the first transmitting interdigital transducer to receive surface acoustic waves generated by the first transmitting interdigital transducer as surface acoustic waves having different phases and transform them to electric signals, the electric signals outputted from the first and second receiving interdigital transducer are out of phase by 180°, and inputted to the balanced type surface acoustic wave filter as balanced signals. The balanced signals outputted from the balanced type surface acoustic wave filter are inputted to the second and third transmitting interdigital transducers connected to the balanced type surface acoustic wave filter. In this case, since the second and third interdigital transducers have one each terminal grounded, electric signals having opposite phases are inputted to the second and third interdigital transducers. When the balanced signals are inputted to the second and third transmitting interdigital transducers, surface acoustic waves are generated by the second and third transmitting interdigital transducers, and the surface acoustic waves are received at the third receiving interdigital transducer. In this case, since the third receiving interdigital transducer has one terminal grounded, and is located to receive surface acoustic waves generated by the second and third transmitting interdigital transducers and transform them to electric signals, the surface acoustic waves received at the third receiving interdigital transducers have the same phase. Therefore surface acoustic waves received at the third receiving interdigital transducer are transformed to electric signals as unbalanced signals, and outputted from the third receiving interdigital transducer. Accordingly, even when the peripheral circuits at both the input side and output side are an unbalanced type, since a balanced-to-unbalanced transformer circuit is unnecessary, a compact and high quality surface acoustic wave device can be obtained. As a consequence, since a balanced device can be used in high frequency parts, characteristics of a high frequency circuit part can be achieved.

In a preferable example of the above mentioned first to sixth aspects of the present invention that the balanced type surface acoustic wave filter comprises four surface acoustic wave resonators connected in a lattice, a balanced type surface acoustic wave filter can be easily obtained. In this case, in a further preferable example comprising a plurality of connected balanced type surface acoustic wave filters, a surface acoustic wave device having excellent frequency characteristics can be obtained.

In a preferable example of the above mentioned first to sixth aspects of the present invention where the frequency at which the insertion loss of frequency characteristics yielded by the transmitting interdigital transducer and the receiving interdigital transducer is at a minimum is approximately the same as the center frequency .of the balanced type surface acoustic wave filter, the insertion loss of the surface acoustic wave device can be minimized.

Since a preferable example of the above mentioned first, third, fourth and sixth aspects of the present invention comprises an impedance matching circuit located between the output terminals of the receiving interdigital transducer and the input terminals of the balanced type surface acoustic wave filter, loss caused by mismatching of impedance is eliminated and thus a surface acoustic wave device having excellent frequency characteristics can be obtained.

Since a preferable example of the above mentioned second, third, fifth and sixth aspects of the present invention comprises an impedance matching circuit located between the output terminals of the balanced type surface acoustic wave filter and the input terminals of the transmitting interdigital transducer, loss caused by mismatching of impedance is eliminated and thus a surface acoustic wave device having excellent frequency characteristics can be obtained.

In a preferable example of the above mentioned first to sixth aspects of the present invention in which physical properties of the substrate on which the transmitting interdigital transducer and the receiving interdigital transducer are formed differ from physical properties of the substrate on which the balanced type surface acoustic wave filter is formed, a surface acoustic wave device having excellent frequency characteristics can be obtained. In this case, in a preferable example in which the electro-mechanical coupling coefficient of the substrate on which the transmitting interdigital transducer and the receiving interdigital transducer are formed is greater than the electro-mechanical coupling coefficient of the substrate on which the balanced type surface acoustic wave filter is formed, a surface acoustic wave device having excellent frequency characteristics can be obtained. In this case, in a preferable example in which the frequency temperature coefficient of the substrate on which the transmitting interdigital transducer and the receiving interdigital transducer are formed and the frequency temperature coefficient of the substrate on which the balanced type surface acoustic wave filter is formed are approximately the same, the environmental temperature change does not bring about drastic change of frequency characteristics of the surface acoustic wave device. Namely, a surface acoustic wave device having stable frequency characteristics can be obtained. In this case, in a preferable example that the substrate on which the transmitting interdigital transducer and the receiving interdigital transducer are formed and the substrate on which the balanced type surface acoustic wave filter is formed are located in an airtight container, downsizing of the surface acoustic wave device can be achieved. In this case, in a more preferable example the impedance matching circuit located between the output terminals of the receiving interdigital transducer and the input terminals of the balanced type surface acoustic wave filter is formed in an airtight container, downsizing of the surface acoustic wave device would not be hindered by providing an impedance matching circuit. In a further preferable example in which the airtight container comprises a multi-layered dielectric substrate, an impedance matching circuit can easily be contained in an airtight container.

In a preferable example of the above mentioned first to sixth aspects of the present invention that the transmitting interdigital transducer, receiving interdigital transducer and the balanced type surface acoustic wave filter are formed on the same substrate, since the transmitting interdigital transducer, the receiving interdigital transducer and the balanced type surface acoustic wave filter can be electrically connected on the same substrate, downsizing of the surface acoustic wave device can be achieved. Further, since the temperature change of the frequency characteristics of the transmitting interdigital transducer and the receiving interdigital transducer and the temperature change of frequency characteristics of the balanced type surface acoustic wave filter are the same, frequency characteristics can be maintained constant with respect to the change of environmental temperature. In this case, in a preferable example in which the film thickness of the electrode comprising the transmitting interdigital transducer and the receiving interdigital transducer is thicker than the film thickness of the electrode comprising the balanced type surface acoustic wave filter, since the virtual electro-mechanical coupling coefficient of the transmitting interdigital transducer and the receiving interdigital transducer becomes greater, a wider bandwidth of frequency characteristics achieved by the transmitting interdigital transducer and the receiving interdigital transducer can be achieved.

DETAILED DESCRIPTION OF THE INVENTION

The present invention will be further described referring to Examples.

(EXAMPLE 1)

Figure 1:
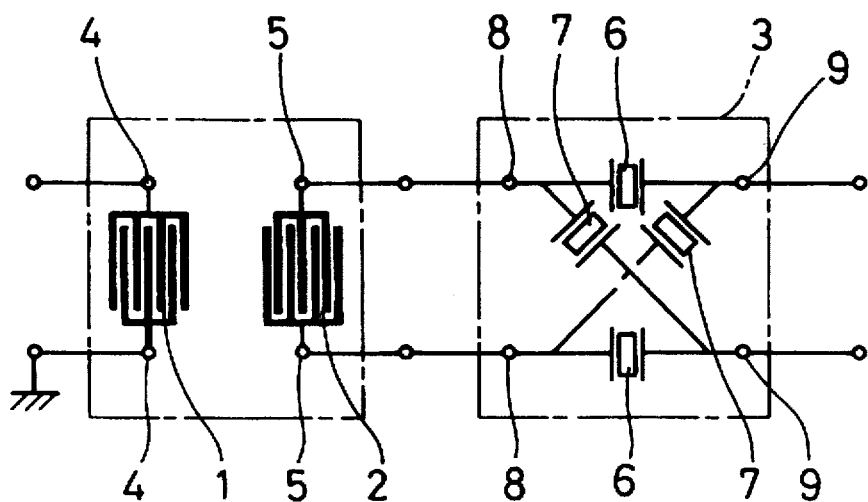
FIG. 1 is a diagram of the first example of the surface acoustic wave devices of the present invention.

FIG. 1 is a diagram illustrating the first Example of surface acoustic wave device of the present invention.

As described in FIG. 1, the transmitting interdigital transducer 1 and the receiving interdigital transducer 2 are formed on a substrate comprising 41° Y cut-X propagation lithium niobate by photolithography. Aluminum comprising approximately 2 weight % of copper as an impurity is used as the material of the electrode.

On the other hand, the balanced type surface acoustic wave filter 3 is formed on a substrate comprising 36° Y cut-X propagation lithium tantalate. The balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography as the transmitting interdigital transducer 1 and the receiving interdigital transducer 2. As the electrode material, an aluminum-copper alloy is used. Here the filter characteristics of the balanced type surface acoustic wave filter 3 are provided by having the resonant frequency of the series-arm surface acoustic wave resonator 6 and the anti resonant frequency of the crossed-arm surface acoustic wave resonator 7 approximately the same.

The substrate on which the transmitting interdigital transducer 1 and the receiving interdigital transducer 2 are formed and the substrate on which the balanced type surface acoustic wave filter 3 is formed are located in a ceramic package for airtight sealing. The both substrates, and the substrates and the ceramic package are electrically connected with aluminum wires.

One of the input terminals 4 of the transmitting interdigital transducer 1 is grounded. For that, an unbalanced signal is inputted to the transmitting interdigital transducer 1. The output terminals 5 of the receiving interdigital transducer 2 are connected to the input terminals 8 of the balanced type surface acoustic wave filter. Numerals 9 of FIG. 1 denote output terminals of the balanced type surface acoustic wave filter 3.

The operation principle of the above described surface acoustic wave device will be explained.

When unbalanced signals are inputted to the transmitting interdigital transducer 1, surface acoustic waves are generated by the transmitting interdigital transducer 1. The surface acoustic waves generated by the transmitting interdigital transducer 1 are received at the receiving interdigital transducer 2. In this case, since none of the output terminals 5 of the receiving interdigital transducers 2 is grounded, surface acoustic waves which are out of phase by 180° are received at each terminal. Therefore, the surface acoustic waves received the receiving interdigital transducer 2 are transformed to electric signals and inputted to the input terminal 8 of the balanced type surface acoustic wave filter 3 connected to the output terminals 5 of the receiving interdigital transducer 2.

Frequency characteristics achieved by the transmitting interdigital transducer 1 and the receiving interdigital transducer 2 include a sin (x)/x type filter characteristics. Therefore by designing the electrodeso that the frequency at which the insertion loss of the frequency characteristics yielded by the transmitting interdigital transducer 1 and the receiving interdigital transducer 2 is at a minimum is approximately the same as the central frequency of the balanced type surface acoustic wave filter 3, the surface acoustic wave device can have filter characteristics. In this case, since the loss is small in the frequency characteristics yielded by the transmitting interdigital transducer 1 and the receiving interdigital transducer 2 and in the frequency characteristics of the balanced type surface acoustic wave filter 3 in the pass band of the surface acoustic wave device and the loss is large in either case outside the passband, compared to the device comprising a conventional balanced-to-unbalanced transformer circuit, a filter having a wide dynamic range and a high selectivity can be obtained. By designing the electrode so that the frequency at which the insertion loss of the frequency characteristics yielded by the transmitting interdigital transducer 1 and the receiving interdigital transducer 2 is at a minimum is approximately the same as the central frequency of the balanced type surface acoustic wave filter 3, a surface acoustic wave device having good filter characteristics corresponding to the unbalanced input-to-balanced output can be obtained.

In this Example, the balanced type surface acoustic wave filter 3 is formed on a substrate having physical properties different from those of a substrate on which the transmitting interdigital transducer 1 and the receiving interdigital transducer 2 are formed. Namely, the transmitting interdigital transducer 1 and the receiving interdigital transducer 2 are formed on a 41° Y cut-X propagation lithium niobate substrate having a large electro-mechanical coupling coefficient and the balanced type surface acoustic wave filter 3 is formed on a 36° Y cut-X propagation lithium tantalate substrate having a comparatively small electro-mechanical coupling coefficient. By forming such structure, a surface acoustic wave device having good frequency characteristics can be obtained. Attention needs to be paid so that the transmitting interdigital transducer 1 and the receiving interdigital transducer 2 located at the input side to provide a prefilter for the surface acoustic wave filter 3 do not adversely affect the frequency characteristic, especially inband characteristics of the balanced type surface acoustic wave filter 3 located at the output side. For that purpose, in this Example, a 41° Y cut-X propagation lithium niobate substrate having a large electro-mechanical coupling coefficient is used to have a wider frequency bandwidth with a minimum insertion loss (hereinafter abbreviated "bandwidth"). Further, since both substrates have similar frequency temperature coeffients, the characteristics of the surface acoustic wave device would not change drastically even when the environmental temperature changes.

As heretofore mentioned, the structure having the transmitting interdigital transducer 1 with one of the input terminals 4 grounded, the receiving interdigital transducer 2 to transform surface acoustic waves generated by the transmitting interdigital transducer 2 to electric signals, and the balanced type surface acoustic wave filter 3 connected to the receiving interdigital transducer 2 does not require a balanced-to-unbalanced transformer circuit is unnecessary even when the input side peripheral circuit of the surface acoustic wave device is an unbalanced type and the output side peripheral circuit of the surface acoustic wave device is a balanced type. Thus, a compact and high quality surface acoustic wave device can be obtained.

Although a 41° Y cut-X propagation lithium niobate substrate is used as the substrate on which the transmitting interdigital transducer 1 and the receiving interdigital transducer 2 are formed and a 36° Y cut-X propagation lithium tantalate substrate is used as the substrate on which the balanced type surface acoustic wave filter 3 is formed in this Example, a combination of substrates is not limited to this embodiment.

Although the transmitting interdigital transducer 1 and the receiving interdigital transducer 2 are formed on a substrate having physical properties different from those of a substrate on which the balanced type surface acoustic wave filter 3 is formed in this Example, the structure is not limited to this embodiment, and the transmitting interdigital transducer 1 and the receiving interdigital transducer 2, and the balanced type surface acoustic wave filter 3 can be formed on the same substrate. If the transmitting interdigital transducer 1 and the receiving interdigital transducer 2, and the balanced type surface acoustic wave filter 3 are formed on the same substrate, since the transmitting interdigital transducer 1 and the receiving interdigital transducer 2, and the balanced type surface acoustic wave filter 3 can be electrically connected on the same substrate, the surface acoustic wave device can be downsized. Further, if the transmitting interdigital transducer 1 and the receiving interdigital transducer 2, and the surface acoustic wave filter 3 are formed on the same substrate, since the temperature change effect on frequency characteristics of the transmitting interdigital transducer 1 and the receiving interdigital transducer 2 and the temperature change effect on the frequency characteristics of the balanced type surface acoustic wave filter 3 become the same, frequency characteristics can be maintained constant with respect to the temperature change.

If the thickness of the electrode comprising the transmitting interdigital transducer 1 and the receiving interdigital transducer 2 is thicker than the thickness of the electrode transducer 2 comprising the surface acoustic wave filter 3, the effective coupling coefficient of the transmitting interdigital transducer 1 and the receiving interdigital transducer 2 becomes greater, and in this Example a wider bandwidth of the frequency characteristics yielded by the transmitting interdigital transducer 1 and the receiving interdigital transducer 2 can be obtained. As a consequence, the effect of the balanced type surface acoustic wave filter 3 on inband characteristics can be alleviated.

(EXAMPLE 2)

Figure 2:
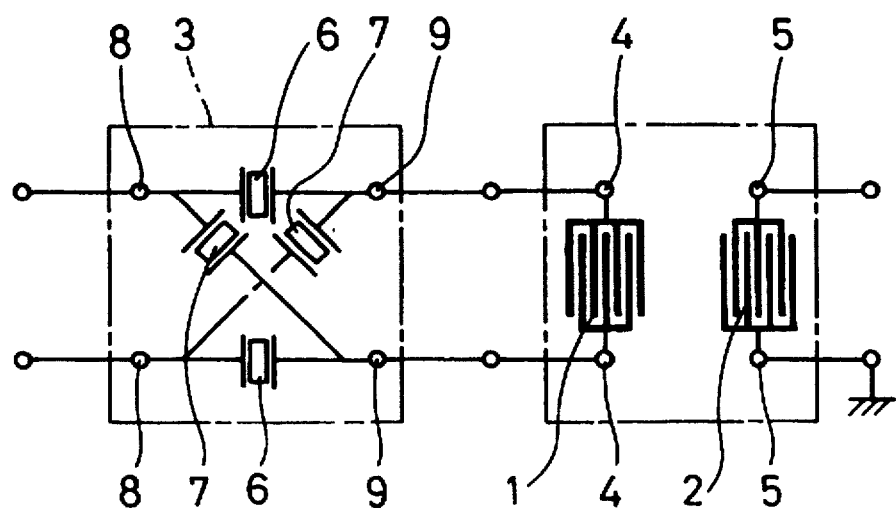
FIG. 2 is a diagram of the second example of the surface acoustic wave devices of the present invention.

FIG. 2 is a diagram illustrating the second Example of the surface acoustic wave devices of the present invention.

As described in FIG. 2, the transmitting interdigital transducer 1, the receiving interdigital transducer 2 and the balanced type surface acoustic wave filter 3 are formed on a substrate comprising 36° Y cut-X propagation lithium tantalate by photolithography. Aluminum comprising approximately 2 weight % of copper as an impurity is used as the material of the electrode. As in Example 1, the balanced type surface acoustic wave filter 3 comprises two series-arm surface acoustic wave resonators 6 and two crossed-arm surface acoustic wave resonators 7 connected in a lattice. The substrate on which the transmitting interdigital transducer 1 and the receiving interdigital transducer 2, and the balanced type surface acoustic wave filter 3 are formed is located in a ceramic package. The substrate and the terminals of the ceramic package are electrically connected with aluminum wires.

The output terminals 9 of the surface acoustic wave filter 3 are connected to the input terminals 4 of the transmitting interdigital transducer 1. One of the output terminals 5 of the receiving interdigital transducer 2 is grounded. Therefore surface acoustic waves received at the receiving interdigital transducer 2 are transformed to electric signals as unbalanced signals. Numerals 8 in FIG. 2 denote input terminals of the balanced type surface acoustic wave filter 3.

The operation principle of the above described surface acoustic wave device will be explained.

Balanced signals are inputted to the input terminals 8 of the surface acoustic wave filter 3. By this, certain frequency characteristics are provided to the balanced signals. Then the inputted signals are outputted from the output terminals 9 of the balanced type surface acoustic wave filter 3 as balanced signals. The aforementioned balanced signals provided with certain frequency characteristics are inputted to the transmitting interdigital transducer 1 connected to the output terminals 9 of the balanced type surface acoustic wave filter 3. When the balanced signals are inputted to the transmitting interdigital transducer 1, surface acoustic waves are generated by the transmitting interdigital transducer 1. The surface acoustic waves generated by the transmitting interdigital transducer 1 are received at the receiving interdigital transducer 2. In this case, since one of the output terminals 5 of the receiving interdigital transducer 2 is grounded, the surface acoustic waves received at the receiving interdigital transducer 2 are transformed to electric signals as unbalanced signals.

As heretofore mentioned, the structure having the balanced type surface acoustic wave filter 3, the transmitting interdigital transducer 1 connected to the balanced type surface acoustic wave filter 3, and the receiving interdigital transducer 2 with one of the output terminals 5 grounded and to transform surface acoustic waves generated at the transmitting interdigital transducer 1 to electric signals does not require a balanced-to-unbalanced transformer circuit even when the input side peripheral circuit of the surface acoustic wave device is a balanced type and the output side peripheral circuit of the surface acoustic wave device is an unbalanced type. Thus, a compact and high quality surface acoustic wave device can be obtained.

Although the transmitting interdigital transducer 1 and the receiving interdigital transducer 2, and the balanced type surface acoustic wave filter 3 are formed on the same substrate in this Example, the structure is not limited to this embodiment, and the transmitting interdigital transducer 1 and the receiving interdigital transducer 2, and the balanced type surface acoustic wave filter 3 can be formed on substrates having different physical properties.

(EXAMPLE 3)

Figure 3:
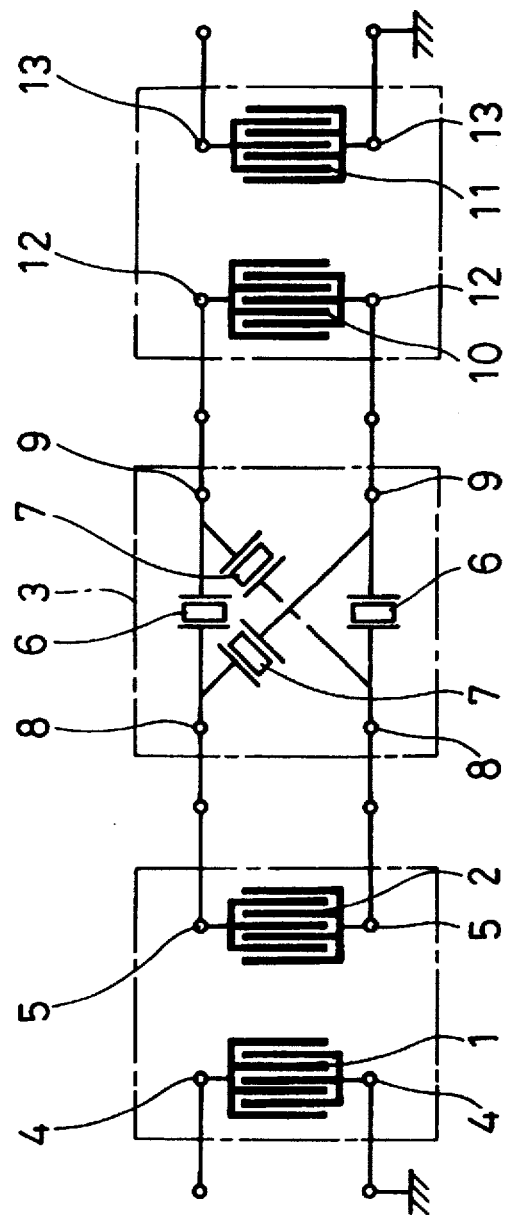
FIG. 3 is a diagram of the third example of the surface acoustic wave devices of the present invention.

FIG. 3 is a diagram illustrating the third Example of the surface acoustic wave devices of the present invention.

As described in FIG. 3, the first and second transmitting interdigital transducers 1, 10 and the first and second receiving interdigital transducers 2, 11 are formed on a substrate comprising 41° Y cut-X propagation lithium niobate by photolithography. Aluminum comprising approximately 2 weight % of copper as an impurity is used as the material of the electrode.

On the other hand, the balanced type surface acoustic wave filter 3 is formed on a substrate comprising 36° Y cut-X propagation lithium tantalate. As in Example 1, the balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography as the first and second transmitting interdigital transducers 1, 10 and the first and second receiving interdigital transducers 2, 11. As the electrode material, an aluminum-2 weight % copper alloy is used. The substrate on which the first and second transmitting interdigital transducers 1, 10 and the first and second receiving interdigital transducers 2, 11 are formed and the substrate on which the balanced type surface acoustic wave filter 3 is formed are located in a ceramic package. Both substrates, and the substrates and the ceramic package are electrically connected with aluminum wires.

The output terminals 5 of the first receiving interdigital transducer 2 are connected to the input terminals 8 of the balanced type surface acoustic wave filter 3. The output terminals 9 of the surface acoustic wave filter 3 are connected to the input terminals 12 of the second transmitting interdigital transducer 10. One of the input terminals 4 of the first transmitting interdigital transducer 1 is grounded. Therefore unbalanced signals are inputted to the first transmitting interdigital transducer 1. One of the output terminals 13 of the second receiving interdigital transducer 11 is grounded. Therefore surface acounstic waves received at the second receiving interdigital transducer 11 are transformed to electric signals as unbalanced signals.

The operation principle of the above described surface acoustic wave device will be explained.

When unbalanced signals are inputted to the first transmitting interdigital transducer 1, surface acoustic waves are generated by the first transmitting interdigital transducer 1. The surface acoustic waves generated by the first transmitting interdigital transducer 1 are received at the receiving interdigital transducer 2. In this case, since none of the output terminals 5 of the first receiving interdigital transducer 2 is grounded, surface acoustic waves which are out of phase by 180° are received at each terminal. Therefore surface acoustic waves received at the first receiving interdigital transducer 2 are transformed to electric signals as balanced signals, and inputted to the input terminals 8 of the balanced type surface acoustic wave filter 3 connected to the output terminals 5 of the first receiving interdigital transducer 2. By this, certain frequency characteristics are provided to the balanced signals. Then the balanced signals provided with certain frequency characteristics are inputted to the second transmitting interdigital transducer 10 connected to the output terminals 9 of the balanced type surface acoustic wave filter 3 and again surface acoustic waves are generated. The surface acoustic waves generated at the second interdigital transducer 10 are received at the second receiving interdigital transducer 11. In this case, since one of the output terminals 13 of the second receiving interdigital transducer 11 is grounded, the surface acoustic waves received at the second receiving interdigital transducer 11 are transformed to electric signals as unbalanced signals.

Also in this Example, the electrode is designed so that the frequency at which the insertion loss of the frequency characteristics yielded by the first transmitting interdigital transducer 1, and the first receiving interdigital transducer 2, the central frequency of the balanced type surface acoustic wave filter 3 and the central frequency of the frequency characteristics achieved by the second transmitting interdigital transducer 10 and the second receiving interdigital transducer 11 are approximately the same. Since the first transmitting interdigital transducer 1 and the first receiving interdigital transducer 2 are formed on a substrate having a large electro-mechanical coupling coefficient, even taking into account the frequency temperature change of the balanced type surface acoustic wave filter 3, a bandwidth sufficient to cover the pass band can be provided.

As heretofore mentioned, the structure with a first transmitting interdigital transducer 1 with one terminal grounded, a first receiving interdigital transducer 2 to transform surface acoustic waves generated at the first transmitting interdigital transducer 1 to electric signals, a balanced type surface acoustic wave filter 3 connected to the first receiving interdigital transducer 2, a second transmitting interdigital transducer 10 connected to the balanced type surface acoustic wave filter 3 and a second receiving interdigital transducer 11 with one terminal grounded and to transform the surface acoustic waves generated by the second transmitting interdigital transducer 10 to electric signals does not require a balanced-to-unbalanced transformer circuit, even when both input side and output side peripheral circuits of the surface acoustic wave device are an unbalanced type. Thus, a compact and high quality surface acoustic wave device can be obtained.

Although a 41° Y cut-X propagation lithium niobate substrate is used as the substrate comprising the first and second transmitting interdigital transducers 1, 10 and the first and second receiving interdigital transducers 2, 11, and a 36° Y cut-X propagation lithium tantalate substrate is used as the substrate comprising the balanced type surface acoustic wave filter 3 in this Example, the substrates are not limited to this embodiment.

Although a one-stage balanced type surface acoustic wave device 3 comprising two series-arm surface acoustic wave resonators 6 and two crossed-arm surface acoustic wave resonators 7 connected in a lattice is disclosed, the structure of the balanced type surface acoustic wave filters is not limited to this embodiment, and a balanced type surface acoustic wave filter comprising a plurality of connected lattice type circuits can be used as well. When a balanced type surface acoustic wave filter comprising a plurality of lattice type circuits is used, a sufficient out of band attenuation of the surface acoustic wave device can be secured. When the stopband frequency of the frequency characteristics yielded by the first transmitting interdigital transducer i and the first receiving interdigital transducer 2, and the stopband frequency of the frequency characteristics yielded by the second transmitting interdigital transducer 10 and the second receiving interdigital transducer 11 are different, a sufficient out of band attenuation of the surface acoustic wave device can be secured as well.

Although the first and second transmitting interdigital transducers 1, 10 and the first and second receiving interdigital transducers 2, 11, and the balanced type surface acoustic wave filter 3 are formed on substrates having different physical properties in this Example, the structure is not limited to this embodiment, but the first and second transmitting interdigital transducers 1, 10, the first and second receiving interdigital transducers 2, 11, and the balanced type surface acoustic wave filter 3 can be formed on the same substrate. By forming the first and second transmitting interdigital transducers 1, 10, the first and second receiving interdigital transducers 2, 11 and the balanced type surface acoustic wave filter 3 on the same substrate, the first and second transmitting interdigital transducers 1, 10, the first and second receiving interdigital transducers 2, 11, and the balanced type surface acoustic wave filter 3 can be electrically connected on the same substrate, and the surface acoustic wave device can be downsized. Further, when the first and second transmitting interdigital transducers 1, 10, the first and second receiving interdigital transducers 2, 11 and the balanced type surface acoustic wave filter 3 are formed on the same substrate, since a temperature change effect on frequency characteristics of the first and second transmitting interdigital transducers 1, 10 and the first and second receiving interdigital transducers 2, 11 and a temperature change effect on frequency characteristics of the balanced type surface acoustic wave filter 3 are the same, frequency characteristics can be maintained stable with respect to the environmental temperature.

When the thickness of the electrode comprising the first and second transmitting interdigital transducers 1, 10 and the first and second receiving interdigital transducers 2, 11 is thicker than the thickness of the electrode comprising the balanced type surface acoustic wave filter 3, the effective electro-mechanical coupling coefficient of the first and second transmitting interdigital transducers 1, 10 and the first and second receiving interdigital transducers 2, 11 becomes greater, and in this Example a wider band width of frequency characteristics yielded by the first and second transmitting interdigital transducers 1, 10 and the first and second receiving interdigital transducers 2, 11 can be provided. As a consequence, the effect of the balanced type surface acoustic wave filter 3 on the inband characteristics can be alleviated.

(EXAMPLE 4)

Figure 4:
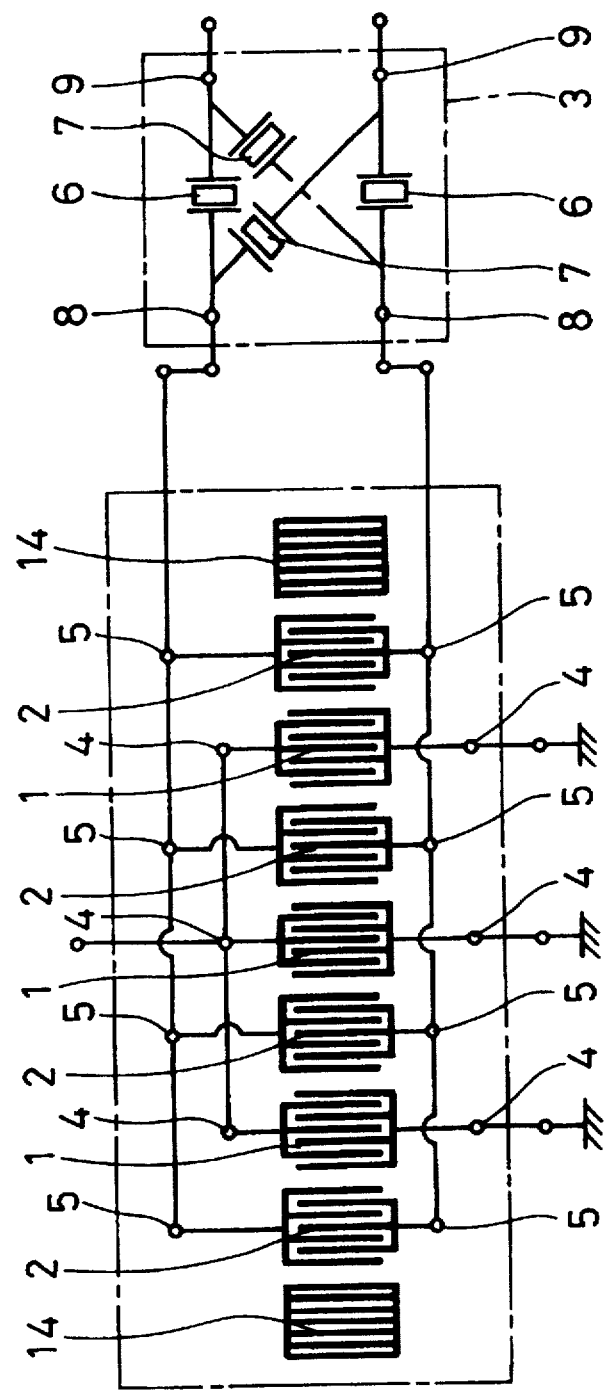
FIG. 4 is a diagram of the fourth example of the surface acoustic wave devices of the present invention.

FIG. 4 is a diagram illustrating the fourth Example of surface acoustic wave devices of the present invention.

As described in FIG. 4, a plurality of the transmitting interdigital transducers 1 and a plurality of the receiving interdigital transducers 2, are formed alternately with respect to the propagation direction of surface acoustic waves, with the receiving interdigital transducers 2 at both ends, on a substrate comprising 41° Y cut-X propagation lithium niobate. Namely, a conventional surface acoustic wave filter with a multi-electrode structure is used as the balanced-to-unbalanced transformer circuit. The 41° Y cut-X propagation lithium niobate substrate further comprises one pair of reflectors 14 at both outer ends of the plurality of the transmitting interdigital transducers 1 and the plurality of the receiving interdigital transducers 2. The transmitting interdigital transducers 1, the receiving interdigital transducers 2 and the reflectors 14 are formed by photolithography. Aluminum comprising approximately 2 weight % of copper as an impurity is used as the material of the electrode.

On the other hand, the balanced type surface acoustic wave filter 3 is formed on a substrate comprising 36° Y cut-X propagation lithium tantalate. As in the Example 1, the balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography like the transmitting interdigital transducers 1, the receiving interdigital transducers 2, and the reflectors 14. As the electrode material, an aluminum-copper alloy is used.

One of the input terminals 4 of each transmitting interdigital transducer 1 is grounded. Therefore unbalanced signals are inputted to the transmitting interdigital transducers 1. The output terminals 5 of each receiving interdigital transducer 2 are connected to the input terminals 8 of the balanced type surface acoustic wave filter. Numerals 9 in FIG. 4 denote the output terminals of the balanced type surface acoustic wave filter 3.

As heretofore mentioned, by having the structure with a plurality of the transmitting interdigital transducers 1 and a plurality of the receiving interdigital transducer 2 formed alternately to the propagation direction of surface acoustic waves with the receiving interdigital transducers 2 at both ends, the two-way insertion loss of a surface acoustic wave is reduced and the insertion loss of the surface acoustic wave device is decreased. That is, the frequency characteristics yielded by a pair of the transmitting interdigital transducer 1 and the receiving interdigital transducer 2 can be improved. By improving the frequency characteristics yielded by the transmitting interdigital transducers 1 and the receiving interdigital transducers providing a balanced-to-unbalanced transformer circuit, a superior surface acoustic wave device can be obtained. Further, by having a pair of the reflectors 14 at the outer ends of the plurality of the transmitting interdigital transducers 1 and the plurality of the receiving interdigital transducers 2 located alternately, the insertion loss of the surface acoustic wave device can be further reduced.

By reducing a two-way loss of the surface acoustic wave by comprising a pair of reflectors at both outer ends of the transmitting interdigital transducers and the receiving interdigital transducers or by having the transmitting interdigital transducer with one-nay electrode structure, the characteristics of a surface acoustic wave device can be similarly improved.

(EXAMPLE 5)

Figure 5:
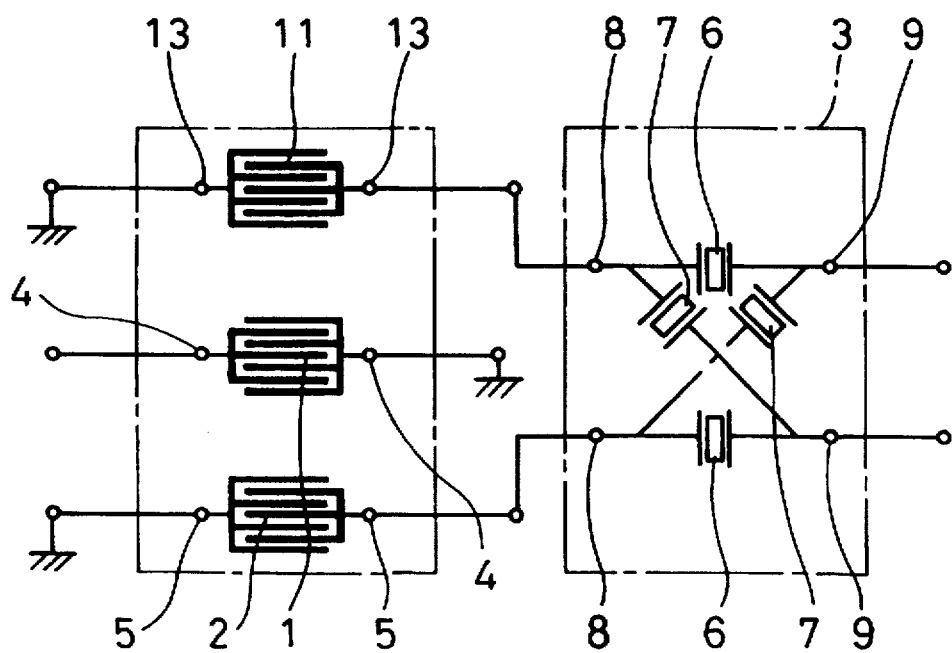
FIG. 5 is a diagram of the fifth example of the surface acoustic wave devices of the present invention.

FIG. 5 is a diagram illustrating the fifth Example of the surface acoustic wave devices of the present invention.

As described in FIG. 5, the transmitting interdigital transducer 1 and the first and second receiving interdigital transducers 2, 11 are formed on a substrate comprising 41° Y cut-X propagation lithium niobate by photolithography. Aluminum comprising approximately 2 weight % of copper as an impurity is used as the material of the electrode. The first and second receiving interdigital transducers 2, 11 are located at the both sides of with the transmiting interdigital transducer 1.

On the other hand, the balanced type surface acoustic wave filter 3 is formed on a substrate comprising 36° Y cut-X propagation lithium tantalate. As in Example 1, the balanced type suface acoustic wave filter 3 comprises trio series-arm surface acoustic wave resonators 6 and two crossed-arm surface acoustic nave resonators 7 connected in a lattice. The electrode pattern on the balanced type surface acoustic wave filter 3 is formed by photolithography as the transmitting interdigital transducer 1, and the first and second receiving interdigital transducers 2, 11. As the electrode material, an aluminum-copper alloy is used. The substrate on which the transmitting interdigital transducer 1 and the first and second receiving interdigital transducers 2, 11 are formed and the substrate on which the balanced type surface acoustic wave filter 3 is formed are located in a ceramic package. Both substrates, and the substrates and the ceramic package are electrically connected with aluminum wires.

One of the input terminals 4 of the transmitting interdigital transducer 1 is grounded. Therefore an unbalanced signal is inputted to the transmitting interdigital transducer 1. The first and second receiving interdigital transducers 2, 11 are located so that one of each of the output terminals 5, 13 is grounded and to receive surface acoustic waves having different phases. In this Example, the first and second receiving interdigital transducers 2, 11 are located so that the surface acoustic wave propagation distance of the transmitting interdigital transducer 1 and the first receiving interdigital transducer 2 and the surface acoustic wave propagation distance of the transmitting interdigital transducer 1 and the second receiving interdigital transducer 11 are out of phase by half a wave length of the surface acoustic wave. The output terminals 5, 13 of the first and second receiving interdigital transducers 2, 11 are connected to the input terminals 8 of the balanced type surface acoustic wave filter 3. Numerals 9 in FIG. 5 denote the output terminals of the balanced type surface acoustic wave filter 3.

The operation principle of the above described surface acoustic wave device will be explained.

When unbalanced signals are inputted to the transmitting interdigital transducer 1, surface acoustic waves are generated by the transmitting interdigital transducer 1. The surface acoustic waves generated by the transmitting interdigital transducer 1 are received at the first and second receiving interdigital transducers 2, 11. The surface acoustic waves received at the first and second receiving interdigital transducers are transformed to electric signals and inputted to the input terminals 8 of the balanced type surface acoustic wave filter 3 connected to the output terminals 5, 13 of the first and second receiving interdigital transducers 2, 11. In this case, since the first and second receiving interdigital transducers 2, 11 have one of each of the output terminals 5, 13 grounded and are located so that surface acoustic waves having different phases are received, the electric signals outputted from the first receiving interdigital transducer 2 and the electric signals outputted from the second receiving interdigital transducer 11 are out of phase by 180° and inputted to the input terminals 8 of the balanced type surface acoustic wave filter 3.

As heretofore mentioned, the structure with a transmitting interdigital transducer 1 with one of the input terminals 4 grounded, first and second receiving interdigital transducers 2, 11 with one of each of the output terminals 5, 13 grounded and located at both ends of the transmitting interdigital transducer 1 to receive the surface acoustic waves generated by the transmitting interdigital transducer 1 as surface acoustic waves having different phases, and a balanced type surface acoustic wave filter 3 connected to the first and second receiving interdigital transducers 2, 11 does not require a balanced-to-unbalanced transformer circuit, even when input side peripheral circuit of the surface acoustic wave device is an unbalanced type and the output side peripheral circuit of the surface acoustic wave device is a balanced type. Thus, a compact and high quality surface acoustic wave device can be obtained.

(EXAMPLE 6)

Figure 6:
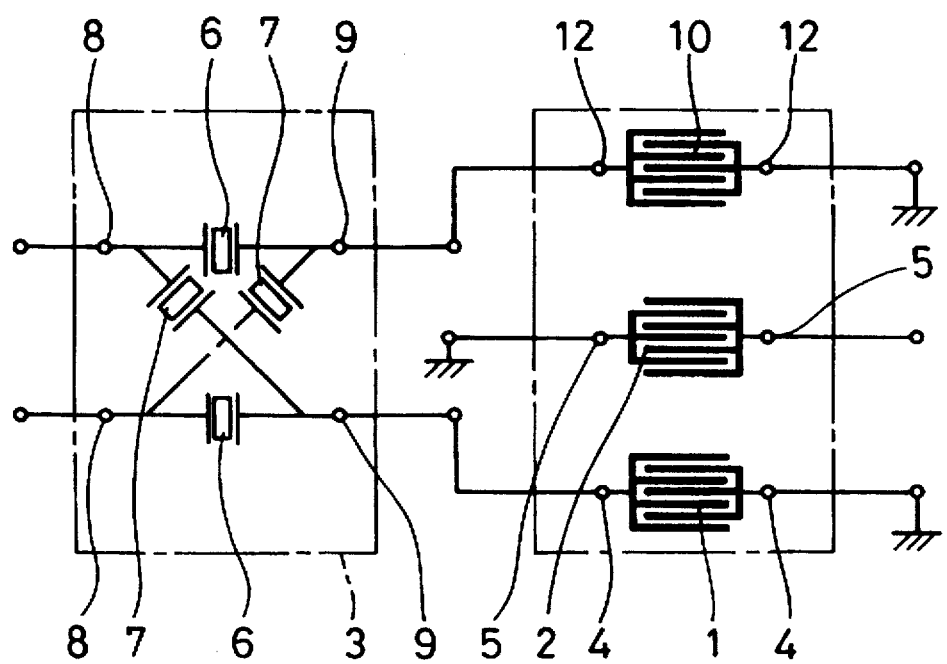
FIG. 6 is a diagram of the sixth example of the surface acoustic wave devices of the present invention.

FIG. 6 is a diagram illustrating the sixth Example of the surface acoustic wave devices of the present invention.

As described in FIG. 6, the first and second transmitting interdigital transducers 1, 10 and the receiving interdigital transducer 2 are formed on a substrate comprising 41° Y cut-X propagation lithium niobate by photolithography. Aluminum comprising approximately 2 weight % of copper as a inpurity is used as the material of the electrode. The first and second transmitting interdigital transducers 1, 10 are located at both sides of the receiving interdigital transducer 2.

On the other hand, the balanced type surface acoustic wave filter 3 is formed on a substrate comprising 36° Y cut-X propagation lithium tantalate. As in the Example 1, the balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography as the first and second transmitting interdigital transducers 1, 10 and the receiving interdigital transducer 2. As the electrode material, an aluminum-copper alloy is used.

The substrate on which the first and second transmitting interdigital transducers 1, 10 and the receiving interdigital transducer 2 are formed and the substrate on which the balanced type surface acoustic wave filter 3 is formed are located integrally in a ceramic package. Both substrates, and the substrates and the ceramic package are electrically connected with aluminum wires.

The output terminals 9 of the balanced type surface acoustic wave filter 3 are connected to the input terminals 4, 12 of the first and second transmitting interdigital transducers 1, 10. One of each of the input terminals 4, 12 of the first and second transmitting interdigital transducers 1, 10 is grounded. Therefore electric signals having opposite phases are inputted to the first and second transmitting interdigital transducers 1, 10. Further, the receiving interdigital transducer 2 has one of the output terminals 5 grounded and is located so that surface acoustic waves generated by the first and second transmitting interdigital transducers 1, 10 are received in phase. In this Example, the receiving interdigital transducer 2 is located so that the surface acoustic wave propagation distance of the first transmitting interdigital transducer 1 and the receiving interdigital transducer 2 and the surface acoustic wave propagation distance of the second transmitting interdigital transducer 10 and the receiving interdigital transducer 2 are out of phase by half a wave length of the surface acoustic wave. By having such a structure, the electric signals inputted to the first and second transmitting interdigital transducers 1, 10 have opposite phases, and the surface acoustic waves generated by the first and second transmitting interdigital transducers 1, 10 and received at the receiving interdigital transducer 2 are in phase. Numerals 8 in FIG. 6 denote input terminals of the balanced type surface acoustic wave filter 3.

The operation principle of the above described surface acoustic wave device will be explained.

Balanced signals are inputted to the input terminals 8 of the balanced type surface acoustic wave filter 3. By this, certain frequency characteristics are provided to the balanced signals. Then the input signals are outputted from the output terminals 9 of the balanced type surface acoustic wave filter 3 as balanced signals. The balanced signals provided with certain frequency characteristics are inputted to the first and second transmitting interdigital transducers 1, 10 connected to the output terminals 9 of the balanced type surface acoustic wave filter 3. In this case, since one of each of the input terminals 4, 12 of the first and second transmitting interdigital transducers 1, 10 is grounded, electric signals having opposite phases are inputted to the first and second transmitting interdigital transducers 1, 10. When the balanced signals are inputted to the first and second transmitting interdigital transducers 1, 10, surface acoustic waves are generated by the first and second transmitting interdigital transducers 1, 10. The surface acoustic waves generated by the first and second transmitting interdigital transducers 1, 10 are received at the receiving interdigital transducer 2. In this case, since the receiving interdigital transducer 2 has one of the output terminals 5 grounded and is located so that the surface acoustic waves generated by the first and second transmitting interdigital transducers 1, 10 are received in phase, surface acoustic waves generated by the first and second transmitting interdigital transducers 1, 10 and received at the receiving interdigital transducer 2 are in phase. Therefore surface acoustic waves received at the receiving interdigital transducer 2 are transformed to electric signals as unbalanced signals and outputted from the output terminals 5 of the receiving interdigital transducer 2.

As heretofore mentioned, the structure with a balanced type surface acoustic wave filter 3, first and second transmitting interdigital transducers 1, 10 connected to the balanced type surface acoustic wave filter 3 with one each of the input terminals 4, 12 grounded and a receiving interdigital transducer 2 with one of the output terminals 5 grounded to receive the surface acoustic waves generated at the first and second transmitting interdigital transducers 1, 10 as surface acoustic waves having the same phase and transform to electric signals, does not require a balanced-to-unbalanced transformer circuit, even when the input side peripheral circuit of the surface acoustic wave device is a balanced type and the output side peripheral circuit of the surface acoustic wave device is an unbalanced type. Thus, a compact and high quality surface acoustic wave device can be obtained.

(EXAMPLE 7)

Figure 7:
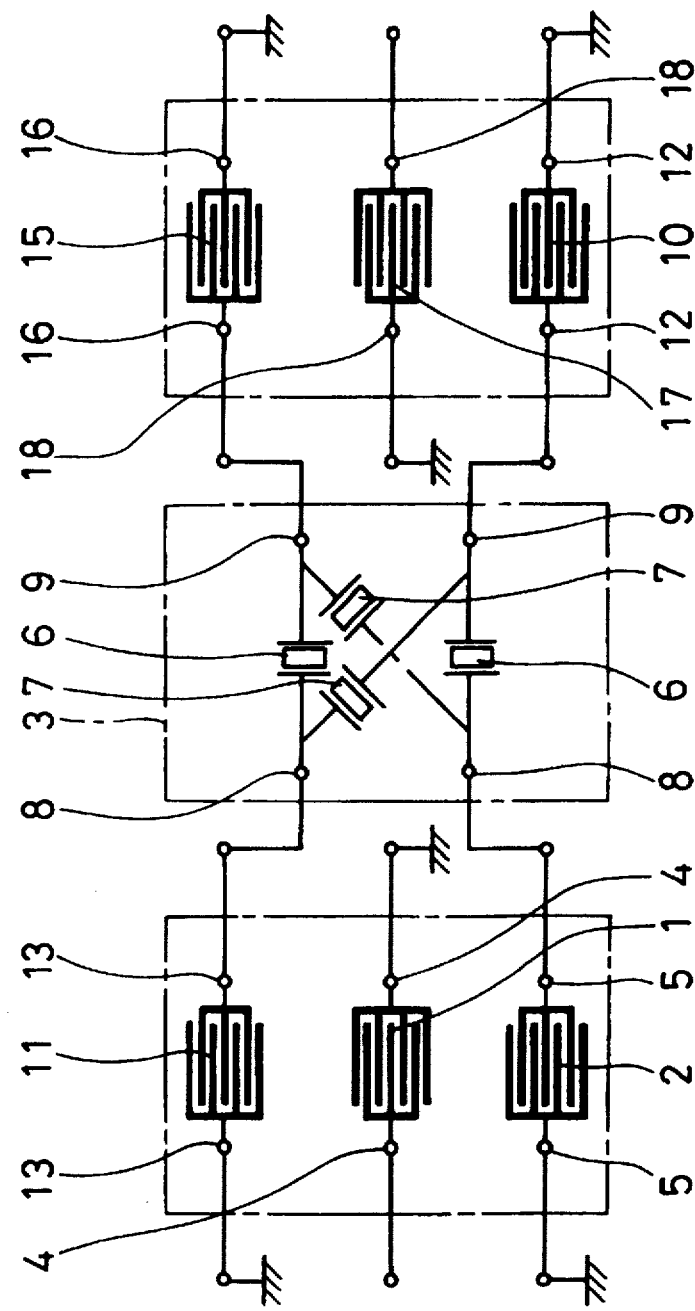
FIG. 7 is a diagram of the seventh example of the surface acoustic wave devices of the present invention.

FIG. 7 is a diagram illustrating the seventh Example of the surface acoustic wave devices of the present invention.

As described in FIG. 7, the first transmitting interdigital transducer 1 and the first and second receiving interdigital transducers 2, 11 are formed on a substrate comprising 41° Y cut-X propagation lithium niobate by photolithography. The second and third transmitting interdigital transducers 10, 15 and the third receiving interdigital transducer 17 are further formed on the substrate comprising 41° Y cut-X propagation lithium niobate by photolithography. Aluminum comprising approximately 2 weight % of copper as an impurity is used as the material of the electrode. The first and second receiving interdigital transducers 2, 11 are located at the sides of the first transmitting interdigital transducer 1 and the second and third transmitting interdigital transducers 10, 15 are located at the sides of the third receiving interdigital transducer 17.

On the other hand, the balanced type surface acoustic wave filter 3 is formed on a substrate comprising 36° Y cut-X propagation lithium tantalate. As in the Example 1, the balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography as the first to third transmitting interdigital transducers 1, 10, 15 and the first to third receiving interdigital transducers 2, 11, 17. As the electrode material, aluminum-copper alloy is used.

The substrate on which the first to third transmitting interdigital transducers 1, 10, 15 and the first to third receiving interdigital transducers 2, 11, 17 are formed and the substrate on which the balanced type surface acoustic wave filter 3 is formed are located in a ceramic package. Both substrates, and the substrates and the ceramic package are electrically connected with aluminum wires.

One of the input terminals 4 of the first transmitting interdigital transducer 1 is grounded. Therefore unbalanced signals are inputted to the first transmitting interdigital transducer 1. The first and second receiving interdigital transducers 2, 11 have one of each of the output terminals 5, 13 grounded and are located to have surface acoustic waves having different phases. In this Example, the first and second receiving interdigital transducers 2, 11 are located so that the surface acoustic wave propagation distance of the first transmitting interdigital transducer 1 and the first receiving interdigital transducer 2 and the surface acoustic wave propagation distance of the first transmitting interdigital transducer 1 and the second receiving interdigital transducer 11 are out of phase by half a wave length of the surface acoustic wave. The output terminals 5, 13 of the first and second receiving interdigital transducers 2, 11 are connected to the input terminals 8 of the balanced type surface acoustic wave filter 3. The output terminals 9 of the balanced type surface acoustic wave filter 3 are connected to the input terminals 12, 16 of the second and third transmitting interdigital transducers 10, 15. One of each of the input terminals 12, 16 of the second and third transmitting interdigital transducers 10, 15 is grounded. Therefore electric signals having reversed phases are inputted to the second and third transmitting interdigital transducers 10, 15. The third receiving interdigital transducer 17 has one of the output terminals 18 grounded and is located to receive the surface acoustic waves generated by the second and third transmitting interdigital transducers 10, 15 in phase. In this Example, the third receiving interdigital transducer 17 is located so that the surface acoustic wave propagation distance of the second transmitting interdigital transducer 10 and the third receiving interdigital transducer 17 and the surface acoustic wave propagation distance of the third transmitting interdigital transducer 15 and the third receiving interdigital transducer 17 have surface acoustic waves out of phase by half a wave length of the surface acoustic wave. By having such structure, the electric signals inputted to the second and third transmitting interdigital transducers 10, 15 have opposite phases, and the surface acoustic waves generated by the second and third transmitting interdigital transducers 10, 15 and received at the third receiving interdigital transducer 17 are in phase.

The operation principle of the above described surface acoustic wave device will be explained.

When unbalanced signals are inputted to the first transmitting interdigital transducer 1, surface acoustic waves are generated by the first transmitting interdigital transducer 1. The surface acoustic waves generated by the first transmitting interdigital transducer 1 are received at the first and second receiving interdigital transducers 2, 11. The surface acoustic waves received at the first and second receiving interdigital transducers 2, 11 are transformed to electric signals and inputted to the input terminals 8 of the balanced type surface acoustic wave filter 3 connected to the output terminals 5, 13 of the first and second receiving interdigital transducers 2, 11. In this case, since the first and second receiving interdigital transducers 2, 11 have one of each of the output terminals 5, 13 grounded and are located to receive surface acoustic waves having different phases, the electric signals outputted from the first receiving interdigital transducer 2 and the electric signals outputted from the second receiving interdigital transducer 11 are out of phase by 180° and inputted to the input terminals 8 of the balanced type surface acoustic wave filter 3 as balanced signals. Then certain frequency characteristics are provided to the balanced signals. The inputted signals are outputted from the output terminals 9 of the balanced type surface acoustic wave filter 3 as balanced signals. The balanced signals provided with certain frequency characteristics are inputted to the second and third transmitting interdigital transducers 10, 15 connected to the output terminals 9 of the balanced type surface acoustic wave filter 3. In this case, since one each of the input terminals 12, 16 of the second and third transmitting interdigital transducers 10, 15 is grounded, electric signals having opposite phases are inputted to the second and third transmitting interdigital transducers 10, 15. When balanced signals are inputted to the second and third transmitting interdigital transducers 10, 15, surface acoustic waves are generated by the second and third transmitting interdigital transducers 10, 15. The surface acoustic waves generated by the second and third transmitting interdigital transducers 10, 15 are received at the third receiving interdigital transducer 17. In this case, since the third receiving interdigital transducer 17 has one of the output terminals 18 grounded and is located to receive the surface acoustic waves generated at the second and third transmitting interdigital transducers 10, 15 in phase, the surface acoustic waves generated at the second and third transmitting interdigital transducers 10, 15 and received at the third receiving interdigital transducer 17 are in phase. Therefore the surface acoustic waves received at the third receiving interdigital transducer 17 are transformed to electric signals as unbalanced signals and outputted from the output terminals 18 of the third receiving interdigital transducer 17.

As heretofore menitoned, the structure with a first transmitting interdigital transducer 1 with one terminal grounded, receiving interdigital transducers 2, 11 with one each of the output terminals 5, 13 grounded and located at both sides of the first transmitting interdigital transducer to receive the surface acoustic waves generated at the first transmitting interdigital transducer 1 as surface acoustic waves having different phases, a balanced type surface acoustic wave filter 3 connected to the first and second receiving interdigital transducers 2, 11, second and third transmitting interdigital transducers 10, 15 connected to the balanced type surface acoustic wave filter 3 with one each of the input terminals 12, 16 grounded and a third receiving interdigital transducer 17 with one of the output terminals 18 grounded and to receive the surface acoustic waves generated at the second and third transmitting interdigital transducers 10, 15 in phase and transform to electric signals, does not require a balanced-to-unbalanced transformer circuit, even when both input side and output side peripheral circuits of the surface acoustic wave device are an unbalanced type. Thus, a compact and high quality surface acoustic wave device can be obtained.

(EXAMPLE 8)

Figure 8:
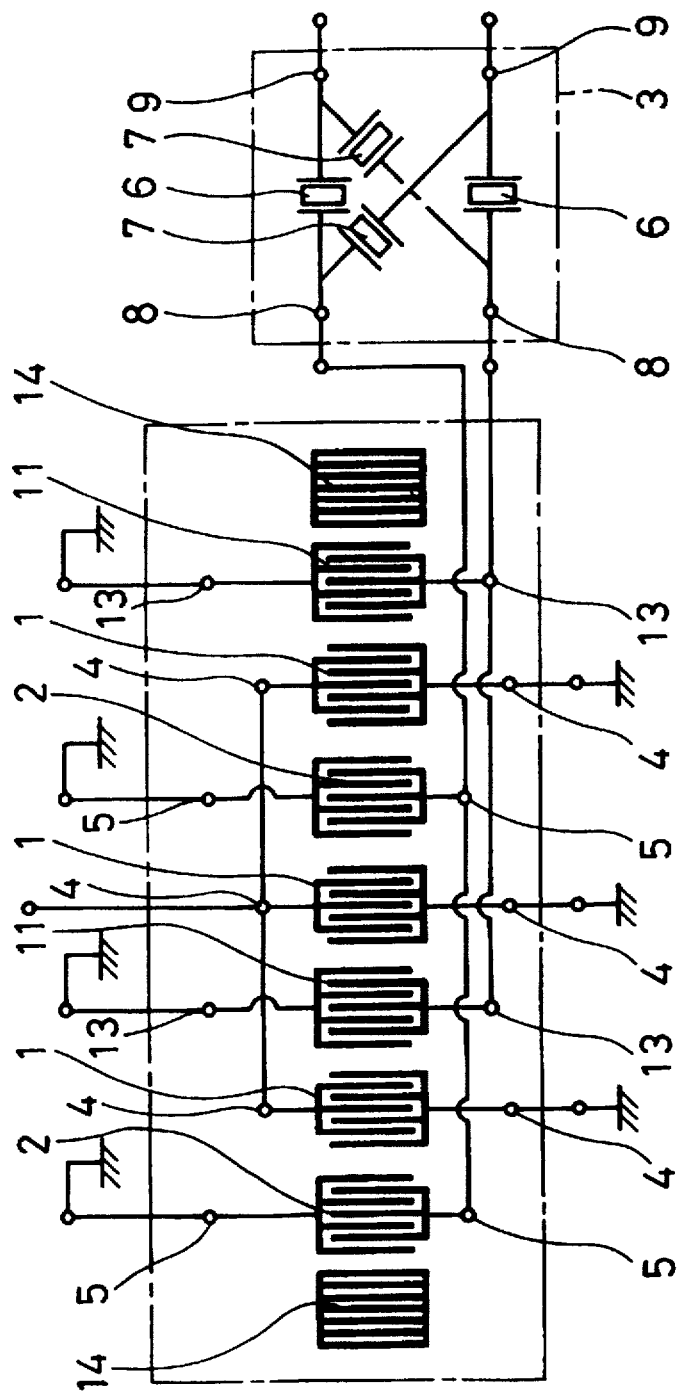
FIG. 8 is a diagram of the eighth example of the surface acoustic wave devices of the present invention.

FIG. 8 is a diagram illustrating the eighth Example of the surface acoustic wave devices of the present invention.

As described in FIG. 8, a plurality of the transmitting interdigital transducers 1 and a plurality of the first and second receiving interdigital transducers 2, 11 are formed alternately with the first and second receiving interdigital transducers 2, 11 located at the ends to the propagation direction of the surface acoustic waves on a substrate comprising 41° Y cut-X propagation lithium niobate by photolithography. The 41° Y cut-X propagation lithium niobate substrate further comprises a pair of the reflectors 14 located at the outer sides of the plurality of the transmitting interdigital transducers 1 and the plurality of the first and second receiving interdigital transducers 2, 11. The transmitting interdigital transducers 1, the first and second receiving interdigital transducers 2, 11 and the reflectors 14 are formed by photolithography. Aluminum comprising approximately 2 weight % of copper as an impurity is used as the material of the electrode.

On the other hand, the balanced type surface acoustic wave filter 3 is formed on a substrate comprising 36° Y cut-X propagation lithium tantalate. As in Example 1, the balanced type suface acoustic wave filter 3 comprises two series-arm surface acoustic wave resonators 6 and two crossed-arm surface acoustic wave resonators 7 connected in a lattice. The electrode pattern on the balanced type surface acoustic wave filter 3 is formed by photolithography like the transmitting interdigital transducers 1, the first and second receiving interdigital transducers 2, 11 and the reflectors 14. As the electrode material, aluminum-copper alloy is used.

One of the input terminals 4 of each transmitting interdigital transducer 1 is grounded. Therefore unbalanced signals are inputted to each transmitting interdigital transducer 1. The first and second receiving interdigital transducers 2, 11 have one of each of the output terminals 5, 13 grounded and are located to receive surface acoustic waves having different phases. In this example, the first and second receiving interdigital transducers 2, 11 are located so that the surface acoustic wave propagation distance of the transmitting interdigital transducers 1 and the first receiving interdigital transducers 2 and the surface acoustic wave propagation distance of the transmitting interdigital transducers 1 and the second receiving interdigital transducers 11 are out of phase by half a wave length. The output terminals 5, 13 of the first and second receiving interdigital transducers 2, 11 are connected to the input terminals 8 of the balanced type surface acoustic wave filter 3. Numerals 9 in FIG. 8 denote output terminals of the balanced type surface acoustic wave filter 3.

As heretofore mentioned, by locating a plurality of the transmitting interdigital transducers 1 and a plurality of the first and second receiving interdigital transducers 2, 11 alternately with the first and second receiving interdigital transducers 2, 11 at the ends to the propagation direction of the surface acoustic waves, two-way loss of the surface acoustic wave is reduced and the insertion loss of the surface acoustic wave device can be decreased. Namely, the frequency characteristics achieved in this embodiment are supeior to those achieved with a structure comprising one transmitting interdigital transducer and two receiving interdigital transducers as in the Examples 5 to 7. By having frequency characteristics superior to those achieved with one transmitting interdigital transducer and two receiving interdigital transducers to provide a balanced-to-unbalanced transformer circuit, a superior surface acoustic wave device can be obtained. By further comprising a pair of the reflectors 14 at the outer ends of the plurality of the transmitting interdigital transducers 1 and the plurality of the first and second receiving interdigital transducers 2, 11, the insertion loss of the surface acoustic wave device can be further reduced.

By reducing the two-way loss of the surface acoustic wave by comprising a pair of reflectors at the outer ends of two transmitting interdigital transducers or two receiving interdigital transducers, by having a structure with a transmitting interdigital transducer or a receiving interdigital transducer of one-way electrode, or by connecting a plurality of sets of one transmitting interdigital transducer and two receiving interdigital transducers, characteristics of the surface acoustic waves can be similarly improved.

(EXAMPLE 9)

Figure 9:
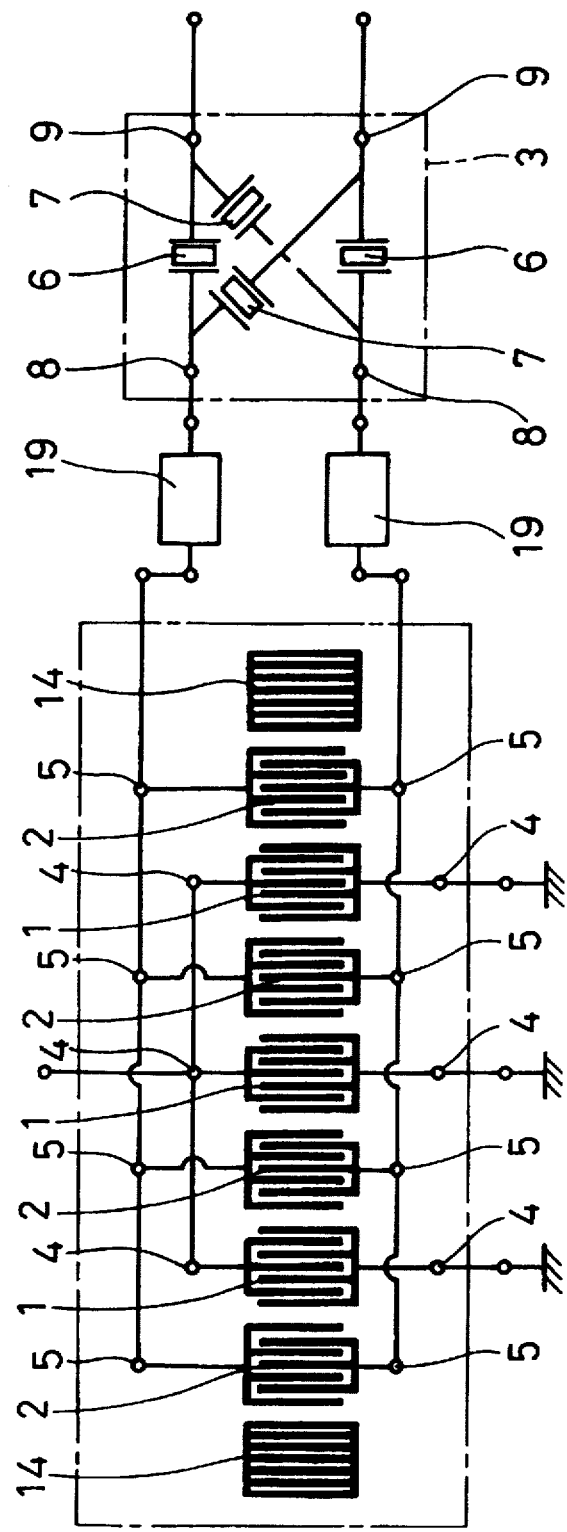
FIG. 9 is a diagram of the ninth example of the surface acoustic wave devices of the present invention.

FIG. 9 is a diagram illustrating the ninth Example of the surface acoustic wave devices of the present invention.

As described in FIG. 9, output terminals 5 of each receiving interdigital transducer 2 are connected to input terminals 8 of the balanced type surface acoustic wave filter 3 via impedance matching circuits 19. Since the other structures are the same as those of Example 4, the same parts bear the same numerals and a detailed description is omitted.

In a surface acoustic wave device having a structure like Examples 1 to 8, comprising transmitting interdigital transducers and receiving interdigital transducers to provide a balanced-to-unbalanced transformer circuit, it may sometimes be difficult to conduct impedance matching only by electrode designing, namely by locating the balanced type surface acoustic wave filter 3 at the input side or at the output side. Since characteristics of a surface acoustic wave device may deteriorate if impedance is not matched, it is preferable to further comprise an impedance matching circuit 19 as in this Example.

By providing an impedance matching circuit 19, a matching circuit device can be located with a surface acoustic wave device in a ceramic package. By containing a matching circuit in a ceramic package, downsizing of the surface acoustic wave device would not be hindered by further including the impedance matching circuit 19. In this case, by having a ceramic package with a multi-layered structure, a matching circuit device can be easily contained in the ceramic package.

An impedance matching circuit to match the impedance of the surface acouustic wave device and the input and output terminals in the peripheral circuits of the surface acoustic device can be further included.

As heretofore mentioned, by having the structure with a part comprising transmitting interdigital transducers and receiving interdigital transducers to provide a balanced-to-unbalanced transformer circuit, a balanced type surface acoustic wave filter 3 located at either input side or output side of the part, and impedance matching circuits 19 therebetween, a surface acoustic wave device with excellent frequency characteristics can be obtained.

Although one balanced type surface acoustic wave filter 3 comprising two series-arm surface acoustic wave resonators 8 and two crossed-arm surface acoustic wave resonators 7 connected in a lattice is used in the above mentioned Examples 1 to 9, the structure is not limited to these embodiments, and a plurality of balanced type surface acoustic wave filters 3 having the above mentioned structure can be connected and used. By using such connected balanced type surface acoustic wave filters 3, a surface acoustic wave filter having excellent frequency characteristics can be obtained.

Figure 10A:
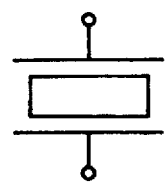
FIGS. 10a–10c are a diagram of a balanced surface acoustic wave filter of the present invention.
Figure 10B:
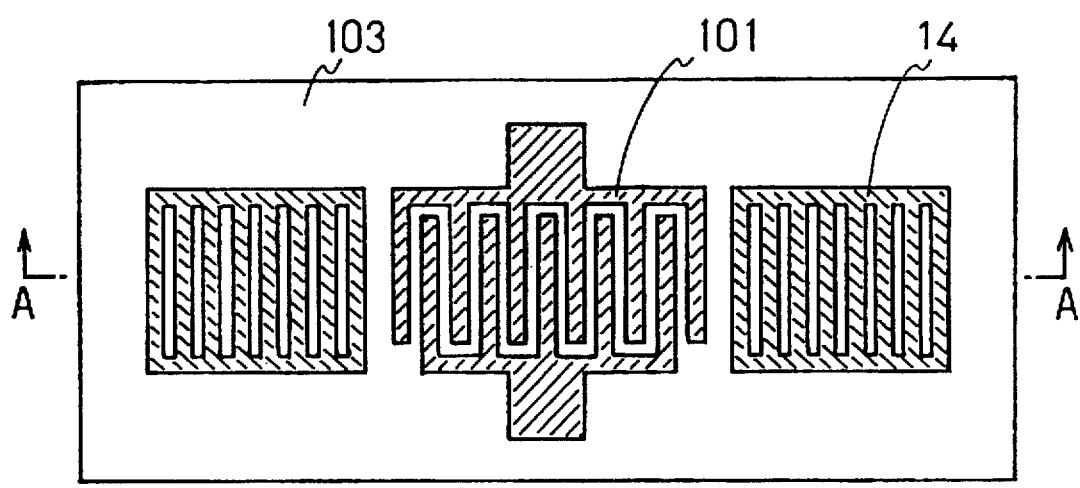
Figure 10C:
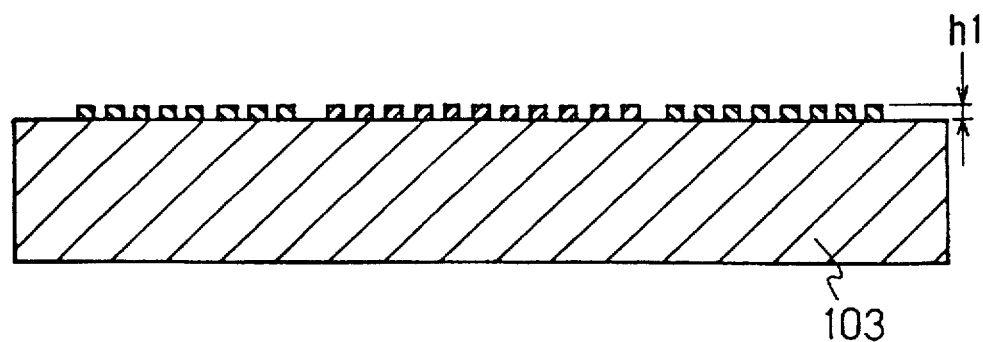

FIG. 10 shows a balanced surface acoustic wave filter where 101 is an interdigital transducer, 14 is a reflector, and 103 is a piezoelectric substrate. FIG. 10(a) is a resonator of the balanced surface acoustic wave filter. FIG. 10(b) is an elevational view showing an electrode structure of the balanced surface acoustic wave filter. FIG. 10(c) is a cross sectional view taken on line A—A of FIG. 10(b). The thickness h1 represents the thickness of the electrode finger of the interdigital transducer 101 and the reflector 102.

Figure 11A:
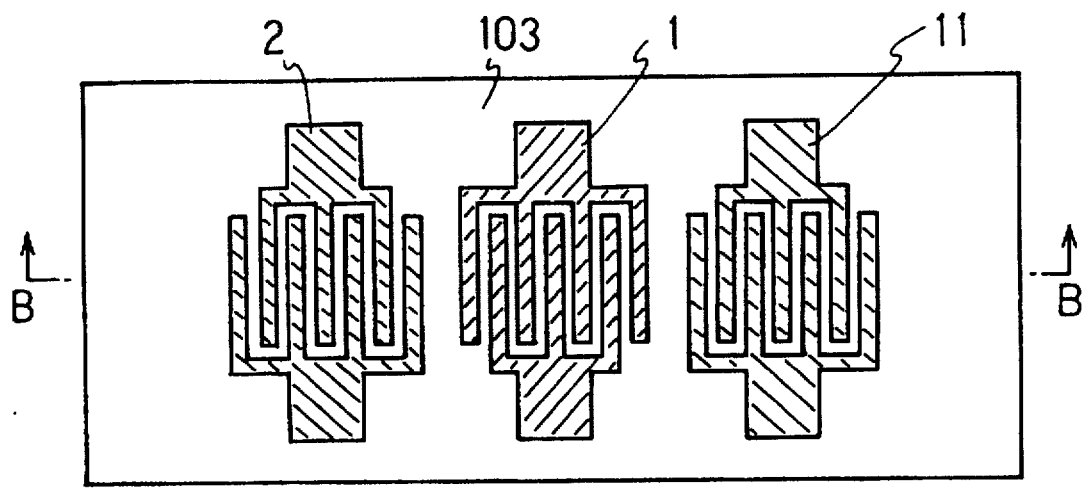
FIGS. 11a–11b are a diagram of a surface acoustic wave device of the present invention.
Figure 11B:
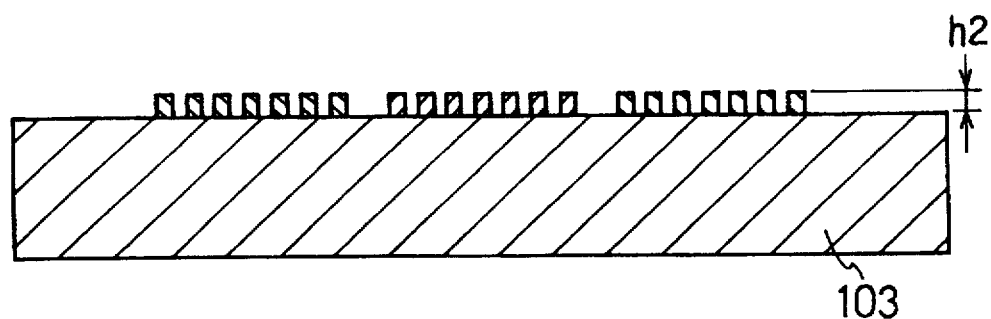

FIG. 11 shows a surface acoustic wave device comprising a transmitting interdigital transducer 1 and first and second receiving interdigital transducers 2, 11. FIG. 11(a) is an elevational view showing an electrode structure of the surface acoustic wave device. FIG. 11(b) is a cross sectional view taken on line B—B of FIG. 11(a). In FIG. 11, 103 is a piezoelectric substrate and h2 represents the thicknesses of the electrode finger of a transmitting interdigital transducer 1 and of the first and second receiving interdigital transducer 2, 11. In one example of the invention, the thickness h2 is thicker than the thickness h1 (FIG. 10(c)) of the electrode comprising the balanced type surface acoustic wave filter.

Figure 12A:
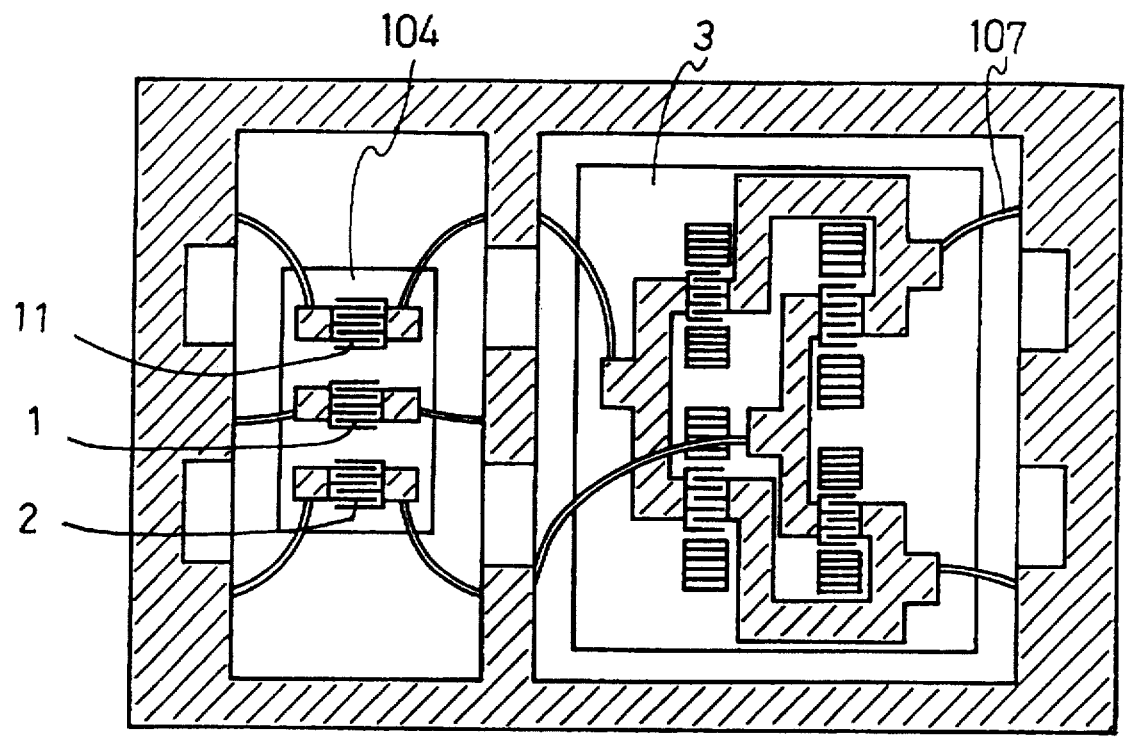
FIGS. 12a–12b are another diagram of a surface acoustic wave device of the present invention.
Figure 12B:
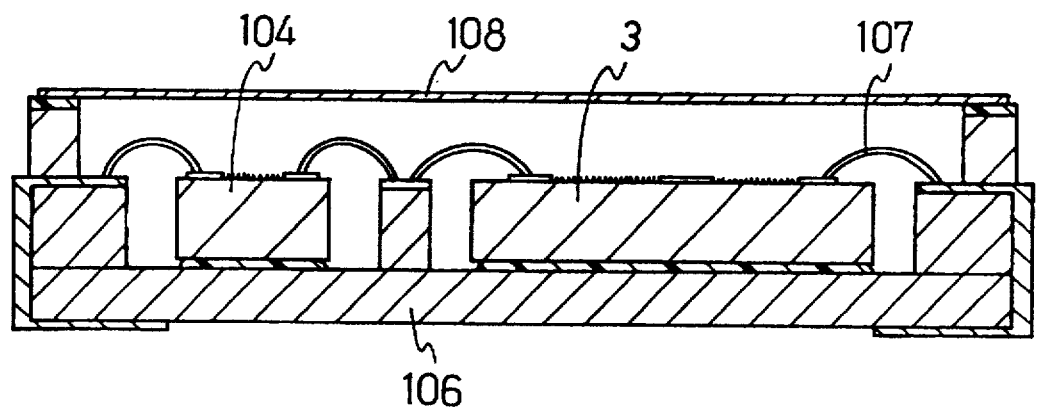

FIG. 12 shows the surface acoustic wave device located in an airtight container 106. In FIG. 12, 107 is a metal wire and 108 is a cover portion. The remaining components are defined previously in the specification. FIG. 12(a) is an elevational view showing the inside of the airtight container 106, and FIG. 12(b) is a cross sectional view of the inside of the airtight container 106.

As heretofore mentioned, the present invention provides surface acoustic wave devices which do not require a balanced-to-unbalanced transformer circuit regardless of the type of the peripheral circuits of the balanced type surface acoustic wave filter, i.e. a balanced type device or an unbalanced type device.

We claim:

1. A surface acoustic wave device comprising a transmitting interdigital transducer with one terminal grounded, first and second receiving interdigital transducers, each with one terminal grounded and located at both sides of the transmitting interdigital transducer to receive surface acoustic waves generated by the transmitting interdigital transducer as surface acoustic waves having opposite phases and transform the surface acoustic waves to electric signals, and a balanced type surface acoustic wave filter connected to the first and second receiving interdigital transducers.

2. The surface acoustic wave device as claimed in claim 1, wherein a plurality of the transmitting interdigital transducers and at least one selected from the group consisting of a plurality of the first receiving interdigital transducer and a plurality of the second receiving interdigital transducer are provided and located alternately with respect to the propagation direction of surface acoustic waves.

3. The surface acoustic wave device as claimed in claim 1, wherein the balanced type surface acoustic wave filter comprises four surface acoustic wave resonators connected in a lattice.

4. The surface acoustic wave device as claimed in claim 1, wherein the frequency at which the insertion loss of the frequency characteristics yielded by the transmitting interdigital transducer and at least one selected from the group consisting of the first receiving interdigital transducer and the second receiving interdigital transducer is at a minimum and the central frequency of the balanced type surface acoustic wave filter are approximately the same.

5. The surface acoustic wave device as claimed in claim 1, wherein the electro-mechanical coupling coefficient of a substrate on which the transmitting interdigital transducer and the first and second receiving interdigital transducers are formed is larger than the electro-mechanical coupling coefficient of a substrate on which the balanced type surface acoustic wave filter is formed, and both the substrates have approximately the same frequency temperature coefficient.

6. The surface acoustic wave device as claimed in claim 5, wherein the substrate on which the transmitting interdigital transducer and the first and second receiving interdigital transducers are formed and the substrate on which the balanced type surface acoustic wave filter is formed are located in an airtight container.

7. The surface acoustic wave device as claimed in claim 6, further comprising an impedance matching circuit located between the output terminals of the balanced type surface acoustic wave filter and the input terminals of the transmitting interdigital transducer, located in the airtight container.

8. The surface acoustic wave device as claimed in claim 1, wherein the transmitting interdigital transducer, the first and second receiving interdigital transducers, and the balanced type surface acoustic wave filter are formed on the same substrate.

9. The surface acoustic wave device as claimed in claim 8, wherein the film thickness of the electrode comprising the transmitting interdigital transducer and the first and second receiving interdigital transducers is thicker than the film thickness of the electrode comprising the balanced type surface acoustic wave filter.

10. The surface acoustic wave device as claimed in claim 9, further comprising an impedance matching circuit located between the output terminals of at least one selected from the group consisting of the, first receiving interdigital transducer and the second receiving interdigital transducer and the input terminals of the balanced type surface acoustic wave filter, wherein the substrate and the impedance matching circuit are located in an airtight container.

11. The surface acoustic wave device as claimed in claim 10, wherein the airtight container comprises a multi-layered dielectric substrate.

12. The surface acoustic wave device as claimed in claim 9, further comprising an impedance matching circuit located between the output terminals of the balanced type surface acoustic wave filter and the input terminals of the transmitting interdigital transducer, wherein the substrate and the impedance matching circuit are located in an airtight container.

13. The surface acoustic wave device as claimed in claim 12, wherein the airtight container comprises a multi-layered dielectric substrate.

14. A surface acoustic wave device comprising at least one transmitting interdigital transducer, at least one receiving interdigital transducer, and a balanced-type surface acoustic wave filter connected to at least one of the transmitting interdigital transducers or to at least one of the receiving interdigital transducer or to both, where at least one of the transmitting interdigital transducers or at least one of the receiving interdigital transducers or both has one terminal grounded, arranged to input a balanced signal to the balanced-type surface acoustic wave filter.

* * * * *